United States Patent
Lee

(10) Patent No.: US 9,236,567 B2
(45) Date of Patent: Jan. 12, 2016

(54) RESISTIVE RANDOM ACCESS MEMORY DEVICE

(71) Applicant: SK hynix Inc., Gyeonggi-do (KR)

(72) Inventor: Jae-Yeon Lee, Gwangju (KR)

(73) Assignee: SK Hynix Inc., Gyeonggi-do (KR)

( * ) Notice: Subject to any disclaimer, the term of this patent is extended or adjusted under 35 U.S.C. 154(b) by 196 days.

(21) Appl. No.: 13/716,053

(22) Filed: Dec. 14, 2012

(65) Prior Publication Data

US 2013/0168634 A1 Jul. 4, 2013

(30) Foreign Application Priority Data

Jan. 4, 2012 (KR) ................ 10-2012-0001228

(51) Int. Cl.
*H01L 45/00* (2006.01)
*H01L 27/24* (2006.01)

(52) U.S. Cl.
CPC ........ *H01L 45/1253* (2013.01); *H01L 27/2463* (2013.01); *H01L 45/06* (2013.01); *H01L 45/08* (2013.01); *H01L 45/085* (2013.01); *H01L 45/12* (2013.01); *H01L 45/122* (2013.01); *H01L 45/143* (2013.01); *H01L 45/144* (2013.01); *H01L 45/146* (2013.01); *H01L 45/147* (2013.01)

(58) Field of Classification Search
CPC . H01L 45/12; H01L 45/1253; H01L 27/2463; H01L 45/06; H01L 45/08; H01L 45/085; H01L 45/122; H01L 45/146; H01L 45/147; G11C 13/0004; G11C 11/5678; G11C 2213/74; G11C 2213/77; G11C 2213/52; G11C 13/0002; G11C 11/56; G11C 2213/54
USPC ............ 257/4, 5; 365/148, 158, 173; 369/126
See application file for complete search history.

(56) References Cited

U.S. PATENT DOCUMENTS

| | | | |
|---|---|---|---|
| 2005/0180191 A1* | 8/2005 | Xu ................................ | 365/145 |
| 2006/0077706 A1* | 4/2006 | Li et al. ........................ | 365/163 |
| 2008/0210932 A1* | 9/2008 | Yukawa et al. ................ | 257/40 |
| 2008/0298114 A1* | 12/2008 | Liu et al. ...................... | 365/148 |
| 2011/0049464 A1* | 3/2011 | Lee et al. ...................... | 257/4 |
| 2011/0161605 A1* | 6/2011 | Lee et al. ...................... | 711/154 |
| 2011/0220860 A1* | 9/2011 | Kim et al. ...................... | 257/4 |
| 2012/0134200 A1* | 5/2012 | Khoueir et al. ............... | 365/158 |
| 2013/0028003 A1* | 1/2013 | Wang et al. ................... | 365/148 |

FOREIGN PATENT DOCUMENTS

| | | |
|---|---|---|
| KR | 1020040063600 | 7/2004 |
| KR | 1020060106035 | 10/2006 |

* cited by examiner

*Primary Examiner* — Matthews Reames
*Assistant Examiner* — John Bodnar
(74) *Attorney, Agent, or Firm* — IP & T Group LLP

(57) ABSTRACT

A resistive memory device includes a lower electrode disposed on a substrate, first and second resistance layers respectively disposed on opposite sides of the lower electrode and exhibiting resistance variation at different voltages, respectively, and an upper electrode disposed on and the first and second resistance layers.

26 Claims, 22 Drawing Sheets

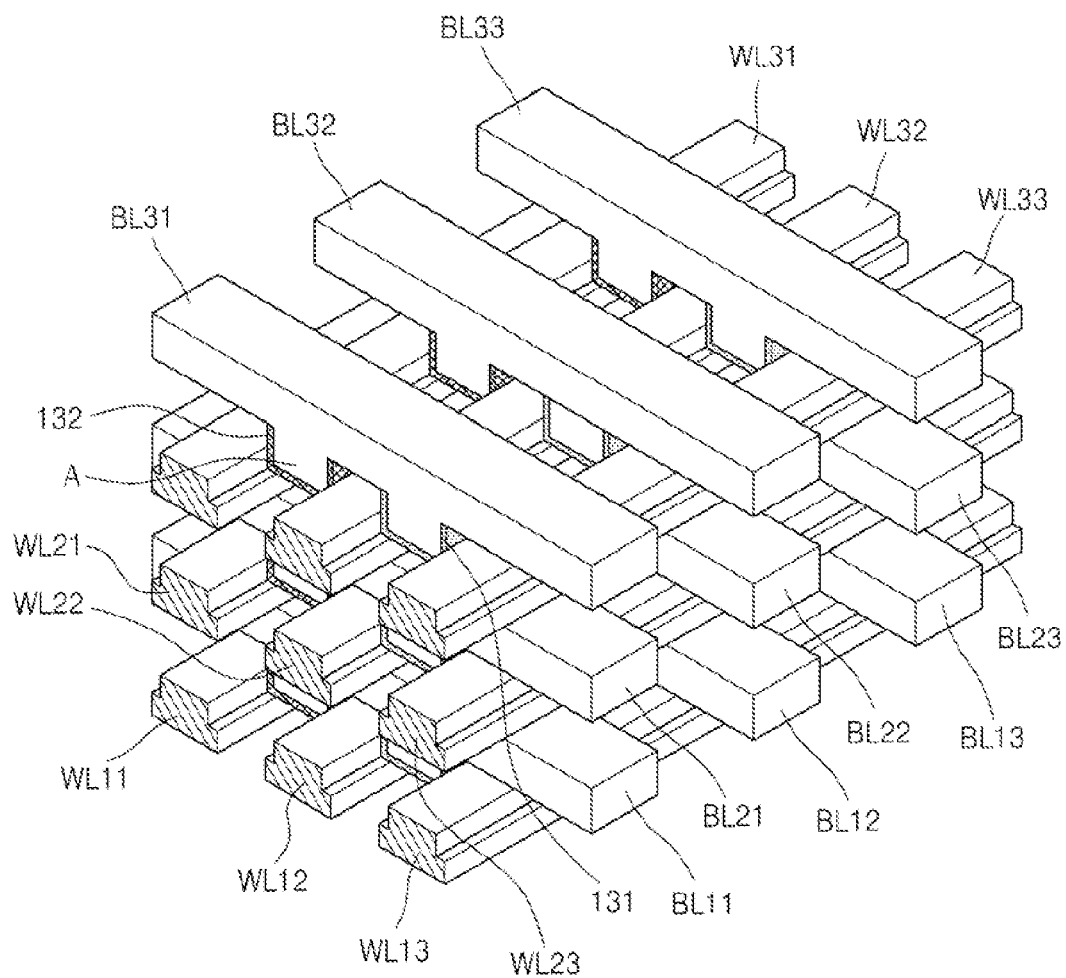

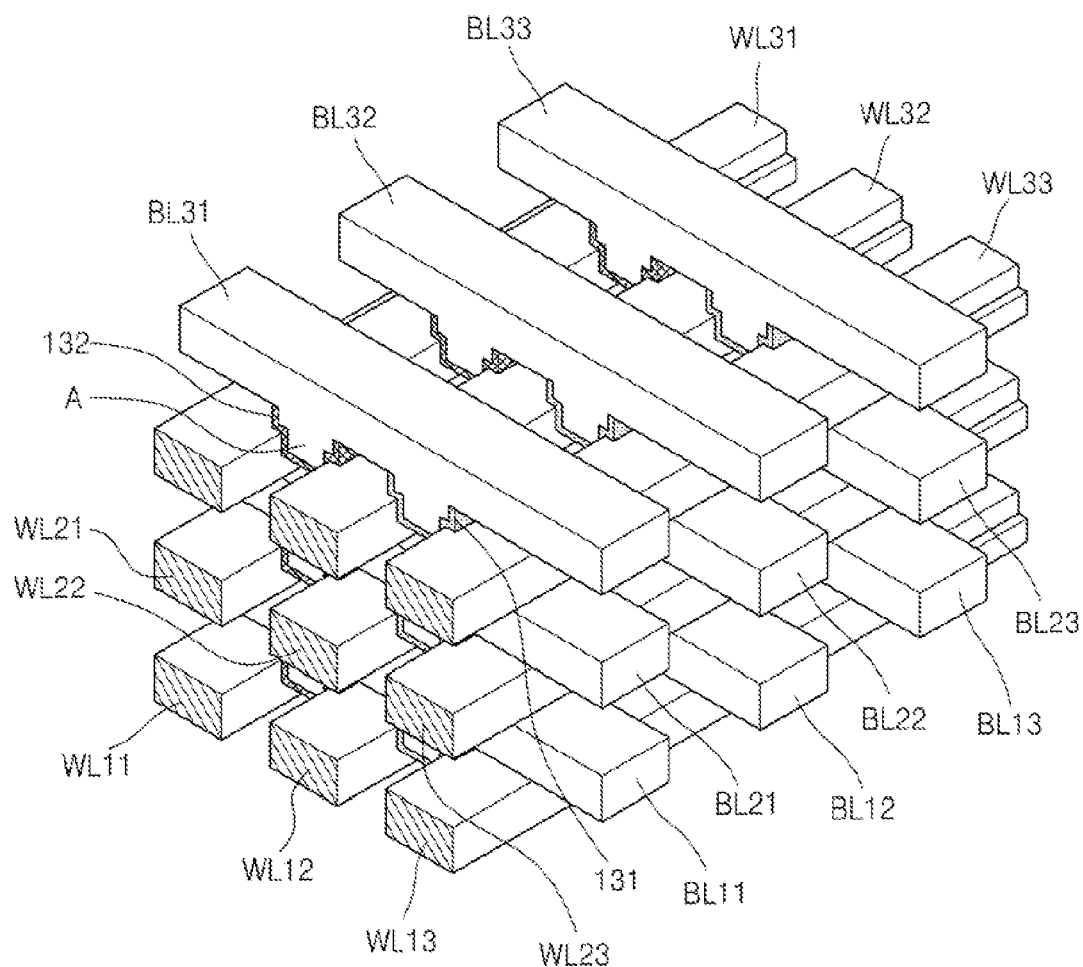

RESISTIVE RANDOM ACCESS MEMORY DEVICE

CROSS-REFERENCE TO RELATED APPLICATION

This application claims the benefit under 35 U.S.C. §119 of Korean Patent Application No. 10-2012-0001228 filed on Jan. 4, 2012 in the Korean Intellectual Property Office, the entirety of which disclosure is incorporated herein by reference.

BACKGROUND

1. Technical Field

The present invention relates to a non-volatile memory device and, more particularly, to a resistive memory device, a system including the same and a method for fabricating the same.

2. Description of the Related Art

With rapid development of digital telecommunication and electronic appliance technologies, conventional memory devices such as a dynamic random access memory (DRAM) or a flash memory ill soon reach their physical limits in obtaining higher integration and higher device performance. For example, a flash memory representing a non-volatile memory uses a high voltage in programming and erase operations and has physical limits due to interference between adjacent cells in being scaled down. Moreover, the flash memory suffers from a low operating speed and high power consumption. As an alternative to conventional memory devices, different types of memory devices are being developed to store data based on different characteristics such as phase transition, magnetic field variation, and the like as follows. As an example, a phase-change memory device may store information by varying resistance of a material by causing a phase change thereof.

A ferroelectric RAM (FeRAM) has been developed but raises a concern with respect to its material stability. A magnetic RAM (MRAM) has also been developed, but it has a complicated fabrication process, a multilayer structure, and a small reading/writing margin. As an alternative to the above-discussed memory devices, a resistive random access memory (ReRAM) has been developed to store data based on resistance variation of a thin film according to voltage applied to the thin film. Theoretically, the ReRAM does not suffer from deterioration even after numerous writing and erasing operations and exhibits normal operation characteristics even at a high temperature. In addition, the ReRAM exhibits non-volatile properties and provides excellent data stability. Furthermore, the ReRAM operates at a high operation speed of 10 to 20 ns in varying resistance variation of 1000 times or more upon application of an input pulse thereto.

Since a variable resistance layer of the ReRAM device is generally a single layer, the ReRAM can be highly integrated and operate at a high speed. Further, typical integration technologies for complementary metal oxide semiconductor (CMOS) can be applied to the ReRAM. Here, the variable resistance layer is generally formed of an oxide. Specifically, the oxide includes a binary oxide and a perovskite oxide. Recently, the variable resistance layer of the ReRAM is often made of a metal-doped perovskite oxide.

As an example of ReRAM devices, Korean Patent Publication No. 2006-106035 discloses a ReRAM device that includes a resistance layer formed of a Cr-doped perovskite oxide of $SrZr_3$.

Korean Patent Publication No. 2004-63600 discloses a ReRAM device which includes an iridium (Ir) substrate, a barrier layer of Ta, TaN, Ti, TiN, TaAlN, TiSiN, TaSiN, TiAl or TiAlN formed on the substrate, and a $Pr_{0.7}Ca_{0.3}MnO_3$ (PCMO) thin film formed as a resistance layer on the barrier layer.

However, since these memory devices are single level devices which allow a device formed at an intersection of an upper data line and a lower data line to store single on/off information, such memory devices have lower data storage capacity per unit area than multi-level devices.

Therefore, it is useful to have a memory device which may be fabricated through a simple fabrication process without surface contamination, is applicable to various memory devices including non-volatile memory devices, and permits adjustment of various resistance states through control of an operating voltage.

BRIEF SUMMARY

The present invention is directed to providing a resistive memory device capable of embodying multi-level data states through a simple process and an electronic system including the same.

The present invention is also directed to providing a method of fabricating a resistive memory device capable of embodying multi-level data states through a simple process.

In accordance with one aspect of the present invention, a resistive memory device includes a lower electrode disposed on a substrate; first and second resistance layers respectively disposed on opposite sides of the lower electrode and exhibiting resistance variation at different voltages, respectively; and an upper electrode disposed on the first and second resistance layers.

In accordance with another aspect of the present invention, a resistive memory device includes a plurality of first conductive lines disposed parallel to each other; a plurality of second conductive lines disposed parallel to each other while intersecting the first conductive lines substantially at a right angle; and resistive memory cells disposed at intersections between the first conductive lines and the second conductive lines. Each of the resistive memory cells comprises a first resistance layer connected to one side of respective one of the first conductive lines and exhibiting resistance variation at a certain voltage and a second resistance layer connected to an opposite side of the respective conductive line and exhibiting resistance variation at a different voltage than that of the first resistance layer.

In accordance with a further aspect of the present invention, a resistive memory device includes a plurality of first data lines disposed parallel to each other; a plurality of second data lines disposed parallel to each other while intersecting the first data lines substantially at a right angle; and first and second resistive memories respectively disposed at opposite sides of each of the first data lines at each of intersections between the first data lines and the second data lines and respectively exhibiting different resistance variation characteristics at a first voltage.

In accordance with yet another aspect of the present invention, an electronic system includes a controller, an input/output unit and a storage unit, which are coupled via a bus. Here, the storage unit is a resistive memory device, which includes a plurality of first data lines disposed parallel to each other; a plurality of second data lines disposed parallel to each other while intersecting the first data lines substantially at a right angle; and first and second resistive memories respectively disposed at opposite sides of each of the first data lines at each of intersections between the first data lines and the second data lines and exhibiting different resistance variation characteristics at a certain voltage.

In accordance with yet another aspect of the present invention, a method of fabricating a resistive memory device includes: forming first conductive lines in a stripe shape on a substrate to be separated at constant intervals from each other; forming an interlayer insulation layer which fills a space between the first conductive lines while covering the first conductive lines; forming a first trench by etching the interlayer insulation layer between a first pair of adjacent first conductive lines and etching one side of each of the first conductive lines; forming a first resistance layer along an inner wall of the first trench; forming a first conductive layer on the first resistance layer to fill the first trench; forming a second trench by etching the first conductive layer between a second pair of adjacent first conductive lines that includes one of the first pair of adjacent first conductive lines, the interlayer insulation layer, and the other side of each of the first conductive lines; forming a second resistance layer along an inner wall of the second trench; forming a second conductive layer on the second resistance layer to fill the second trench; etching the first and second conductive layers and the first and second resistance layers until an upper surface of the interlayer insulation layer is exposed; forming second conductive lines on a structure resulting from the etching of the first and second conductive layers and the first and second resistance layers, wherein the second conductive lines intersect the first conductive lines substantially at a right angle; and forming first and second conductive patterns disconnected from each other by etching the first and second conductive layers.

In accordance with yet another aspect of the present invention, a method of fabricating a resistive memory device, includes: forming first conductive lines in a stripe shape on a substrate to be separated at constant intervals from each other; forming an interlayer insulation layer which fills a space between the first conductive lines while covering the first conductive lines; forming a first trench by etching part of the interlayer insulation layer between a first pair of adjacent first conductive lines and one side of each of the first conductive lines; forming a first resistance layer on an exposed portion including an inner wall of the first trench; forming a photoresist pattern on a surface having the first resistance layer formed thereon; etching another portion of the interlayer insulation layer and the other side of a second pair of adjacent first conductive lines that includes one of the first pan of adjacent first conductive lines using the photoresist pattern as a mask to form a second trench; forming a second resistance layer on an exposed portion including an inner wall of the second trench; etching the first and second conductive layers until an upper surface of the interlayer insulation layer is exposed, followed by removing the remaining photoresist pattern; and; and forming second conductive lines on the first and second resistance layers including the first and second trenches to intersect the first conductive lines substantially at a right angle.

BRIEF DESCRIPTION OF THE DRAWINGS

The above and other aspects, features, and advantages of the invention will become apparent from the detailed description of the following embodiments in conjunction with the accompanying drawings, in which:

FIG. 3b is as cross-sectional view taken along line A-A' of FIG. 3a, FIG. 3c is a cross-sectional view taken along line B-B' of FIG. 3a, FIG. 3d is a cross-sectional view taken along line C-C' of FIG. 3a, and FIG. 3e is a cross-sectional view taken along line D-D' of FIG. 3a;

FIG. 4b is a cross-sectional view taken along line A-A' of FIG. 4a, FIG. 4c is a cross-sectional view taken along line B-B' of FIG. 4a, and FIG. 4d is a cross-sectional view taken along line C-C' of FIG. 4a;

FIG. 5b is a cross-sectional view taken along line A-A' of FIG. 5a, FIG. 5c is a cross-sectional view taken along line B-B' of FIG. 5a, and FIG. 5d is a cross-sectional view taken along line C-C' of FIG. 5a:

FIG. 6b is a cross-sectional view taken along line A-A' of FIG. 6a, FIG. 6c is a cross-sectional view taken along line B-B' of FIG. 6a, and FIG. 6d is a cross-sectional view taken along line C-C' of FIG. 6a;

FIG. 7a is a perspective view of a multilayer structure of the resistive memory array shown in FIG. 3a FIG. 7b is a perspective view of a multilayer structure of the resistive memory array shown in FIG. 4a, FIG. 7c is a perspective view of a multilayer structure of the resistive memory array shown in FIG. 5a, and FIG. 7d is a perspective view of a multilayer structure of the resistive memory array shown in FIG. 6a;

DETAILED DESCRIPTION

Embodiments of the present invention will now be described in detail with reference to the accompanying drawings.

Structure of Resistive Memory Array

Figure 1:
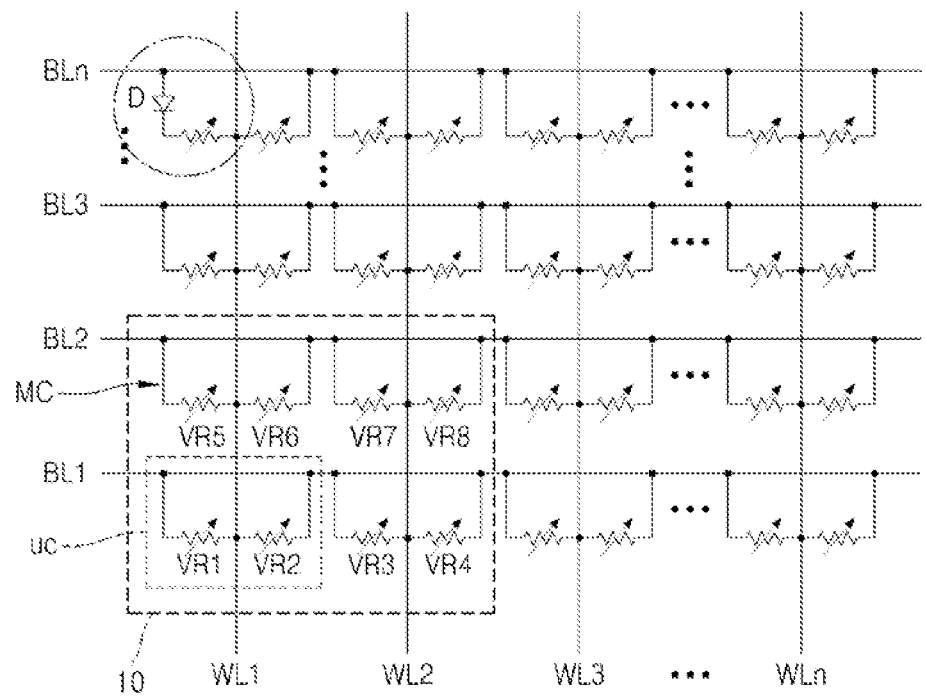
FIG. 1 is an equivalent circuit diagram of part of a resistive memory array in accordance with an exemplary embodiment of the present invention.
Figure 2:
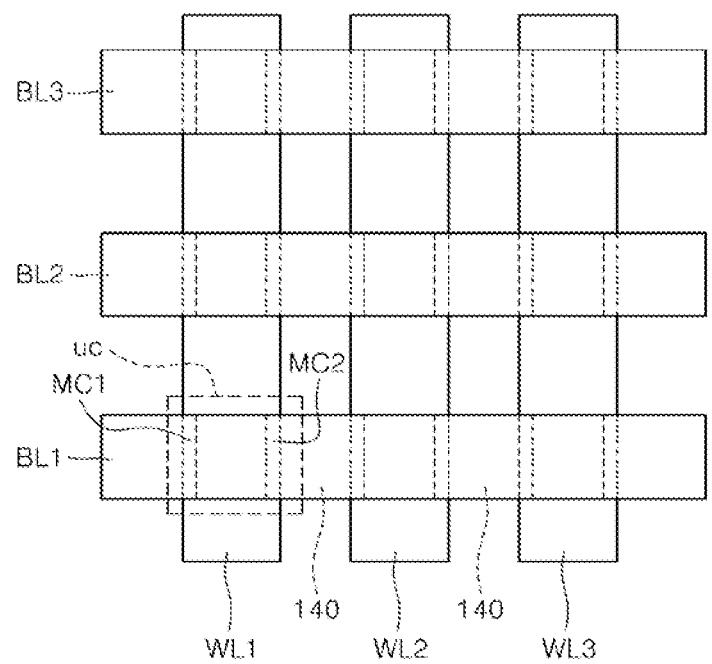
FIG. 2 is a layout diagram of the part of the resistive memory array in accordance with the exemplary embodiment of the present invention.

FIG. 1 is an equivalent circuit diagram of part of a resistive memory array in accordance with an exemplary embodiment, and FIG. 2 is a layout diagram of the part of the resistive memory array in accordance with the exemplary embodiment. Herein, for illustration purposes, a data line in a first direction will be referred to as a word line WL and a data line in a second direction will be referred to as a bit line BL.

Referring to FIG. 1 and FIG. 2, the resistive memory array according to the embodiment includes a plurality of word lines WL1, WL2, WL3, . . . , WLn arranged parallel to each other, a plurality of bit lines BL1, BL2, BL3, . . . , BLn arranged parallel to each other while intersecting the word lines substantially at a right angle, and a plurality of resistive memory cells MC disposed at intersections between the word lines WL1, WL2, WL3, . . . , WLn and the bit lines BL1, BL2, BL3, . . . , BLn.

Each of the resistive memory cells MC stores one or more bits of data using resistance of a variable resistor VR. For example, a variable resistor VR programmed to have a high resistance value may represent a bit data of logic "1", and a variable resistor VR programmed to have, a low resistance value may represent to bit data of logic "0".

Each of the resistive memory cells MC may include such variable resistors VR. In some embodiments, the variable resistor VR may be referred to as a memory cell or a memory material.

The variable resistor VR may be any type of resistor which exhibits resistance variation based on a phase change between a crystalline phase and a non-crystalline phase as in chalcogenide and the like, which exhibits resistance variation by forming a bridge (conductive bridge) between electrodes through extraction of metal and breaking the bridge through ionization of the extracted metal, or which exhibits resistance variation based on movement of oxygen vacancies by a certain voltage or current applied to a transition metal oxide layer.

In this embodiment, one word line, which intersects one bit line, is provided at both sides thereof with one variable resistor VR, thereby constituting a unit cell UC. For example, a first word line WL1 is provided at right and left sides thereof with two variable resistors VR1, VR2, respectively. A control device D may be disposed between each of the variable resistors and the bit line to control an electric, current in the variable resistors. The control device D may be a diode or a transistor, as shown in the drawings.

Here, eight resistive memory cells are disposed within a region defined by a pair of word lines and a pair of bit lines which intersect with the pair of word lines substantially at a right angle. For example, eight resistive memory cells respectively including variable resistors VR1 to VR8 are disposed within a region 10, which is defined by the first and second word lines WL1, WL2 and the first and second bit lines BL1, BL2 which intersect the first and second word lines WL1, WL2.

The two variable resistors VR disposed at the right and left sides of one word line intersecting one bit line switch at different voltages, respectively. In other words, the two variable resistors exhibit different switching characteristics even at the same voltage.

The resistive memory stores data through resistance variation of the variable resistors. Each of the variable resistors is composed of a thin film of a resistive material such as a nickel oxide layer (NiO) or other transition metal oxide layers. With this configuration, the variable resistors may exhibit resistance variation through control of electric current and voltage. At this time, when two variable resistors disposed at opposite sides of one word line are composed of resistive materials exhibiting different resistance variation characteristics, or composed of the same kind of material with different physical properties such as a thickness or a contact area with an electrode, the two variable resistors connected to one word line exhibit different resistance variation characteristics at different voltages.

For example, referring again to FIG. 1, when the first variable resistor VR1 at the left side of the first word line WL1 is formed of a material exhibiting high resistance variation at a voltage $V_1$, and the second variable resistor VR2 at the right side of the first word line is formed of a material exhibiting high resistance variation at a voltage $V_2$ higher than the voltage $V_1$, the two variable resistors VR1, VR2 connected to one word line WL1 exhibit high resistance variation at different voltages.

On the contrary, when the first and second variable resistors VR1, VR2 are formed of the same kind of material, the first variable resistor VR1 may include a first variable resistance layer having a certain thickness, and the second variable resistor VR2 may include a second variable resistance layer which is thicker than the first variable resistance layer. Further, the first variable resistance layer included in the first variable resistor VR1 has a constant contact area with an electrode such as the word line or the hit line, and the second variable resistance layer included in the second variable resistor VR2 has a greater contact area with the electrode than the first variable resistance layer.

In this case, the two variable resistors VR1, VR2 connected to one word line WL1 exhibit high resistance variation at different voltages. Alternatively, each of the first and second variable resistors VR1, VR2 may be formed to have the thickness or contact area with an electrode in an opposite manner to those of the variable resistors described above.

Thus, since two memory cells having different on/off operations according to difference of voltages applied, to the word line and the bit line intersecting each other are connected to one word line, the resistive memory according to this embodiment may have two times greater data storage capacity than the existing ReRAM array. Namely, the resistive memory according to this embodiment may exhibit multi-level data states.

Figure 8:
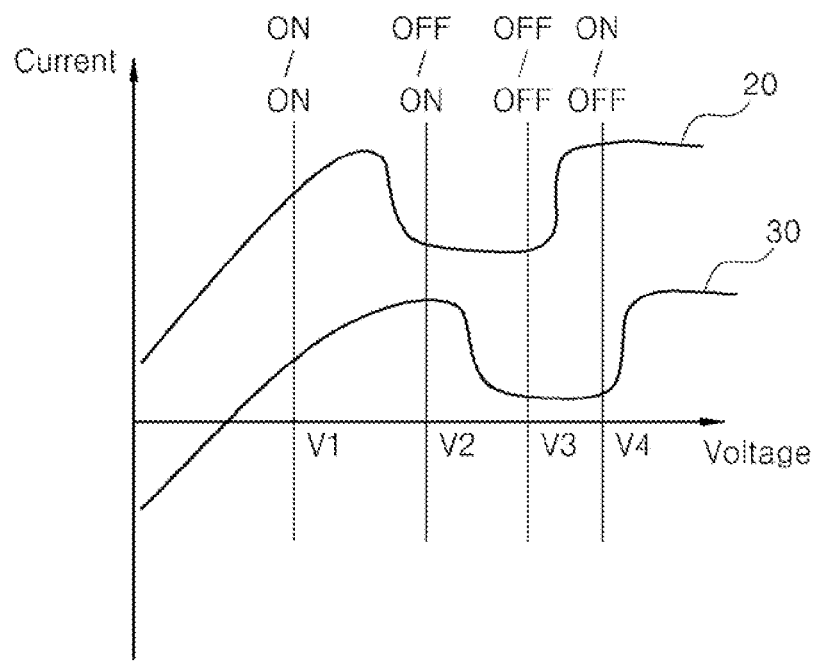
FIG. 8 is a graph depicting a unipolar switching curve of two variable resistance layers exhibiting different resistance variation characteristics.

FIG. 8 is a graph depicting a unipolar switching curve of two variable resistance layers exhibiting different resistance variation characteristics. Reference numerals "20" and "30" represent switching curves of the first and second variable resistance layers, respectively.

Referring to FIG. 8, two variable resistance layers performing an ON/OFF unipolar switching behavior may provide four data states according to applied voltage.

For example, at a voltage V1, both the switching curve 20 of the first variable resistance layer and the switching curve 30 of the second variable resistance layer show an ON state. At a voltage V2, the switching curve 20 of the first variable resistance layer shows an OFF state, and the switching curve 30 of the second variable resistance layer shows an ON state. At a voltage V3, both the switching curve 20 of the first variable resistance layer and the switching curve 30 of the second variable resistance layer show an OFF state. At a voltage V4, the switching curve 20 of the first variable resistance layer shows an ON state and the switching curve 30 of the second variable resistance layer shows an OFF state.

Figure 9:
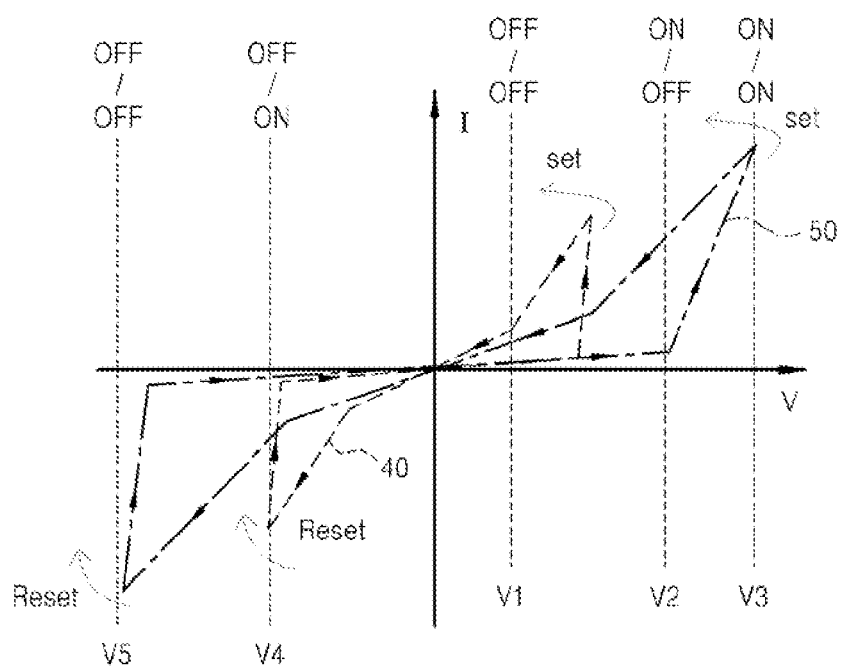
FIG. 9 is a graph depicting a bipolar switching curve of two variable resistance layers exhibiting different resistance variation characteristics.

FIG. 9 is a graph depicting a bipolar switching curve of two variable resistance layers exhibiting different resistance variation characteristics. Reference numerals "40" and "50" show switching curves of the first and second variable resistance layers, respectively.

Referring to FIG. 9, two variable resistance layers performing an ON/OFF bipolar switching behavior may provide four data states according to applied voltages.

For example, at a voltage V1, both the switching curve 40 of the first variable resistance layer and the switching curve 50 of the second variable resistance layer show an OFF state. At a voltage V2, the switching curve 40 of the first variable resistance layer shows an ON state, and the switching curve 50 of the second variable resistance layer shows an OFF state. At a voltage V3, both the switching curve 40 of the first variable resistance layer and the switching curve 50 of the second variable resistance layer show an ON state. At a voltage V4, the switching curve 40 of the first variable resistance layer shows an OFF state, and the switching curve 50 of the second variable resistance layer shows an ON state. Further, at a voltage V5, both the switching curve 40 of the first variable resistance layer and the switching curve 50 of the second variable resistance layer show an OFF state.

As such, four data states are obtained using two variable resistors connected to one word line. Further, when reading data programmed in the resistive memory, a reference output current level is set according to the characteristics of each of the variable resistance layers and a multi-bit data state can be read according to the output current level.

As such, the variable resistance layers disposed at opposite sides of one word line are composed of different materials exhibiting different resistance variation characteristics, or composed of the same kind of material with different properties such as different thicknesses or different sized of contact areas with an electrode so as to exhibit different resistance variation characteristics, thereby enabling operation of a multi-level cell. Namely, the resistive memory device according to this embodiment may store multi-level data states.

Resistive Memory Cell Structure

Figure 3A:
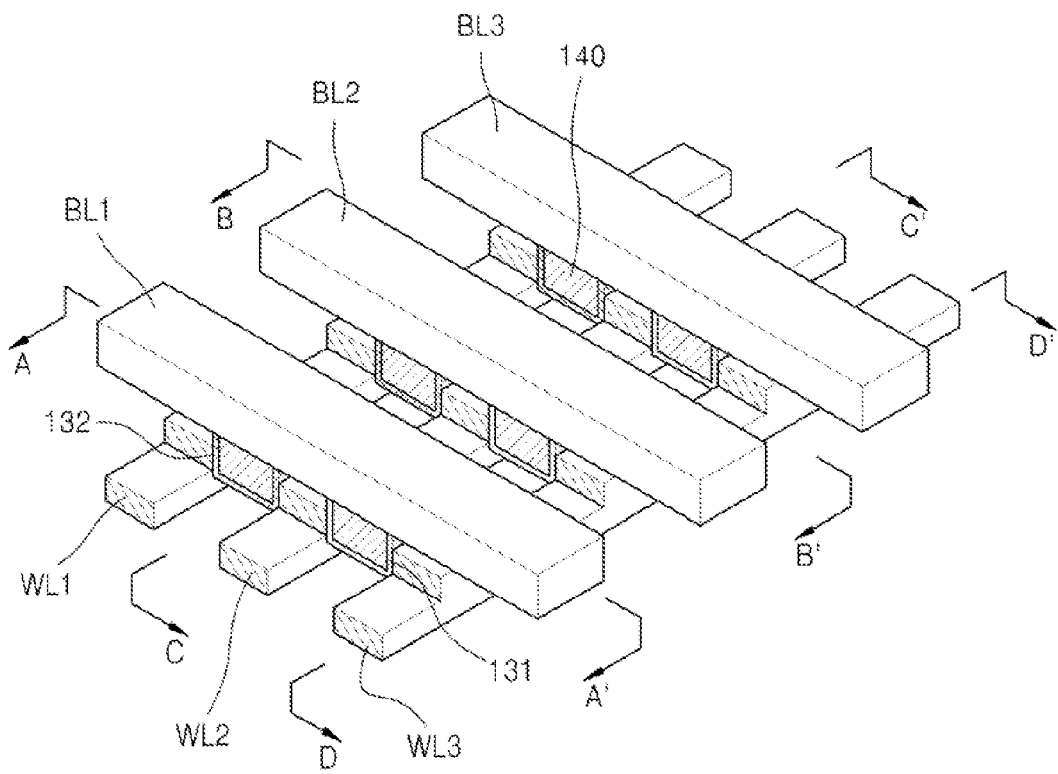
FIG. 3a is a perspective view of a resistive memory array in accordance with a first embodiment of the present invention.
Figure 3B:
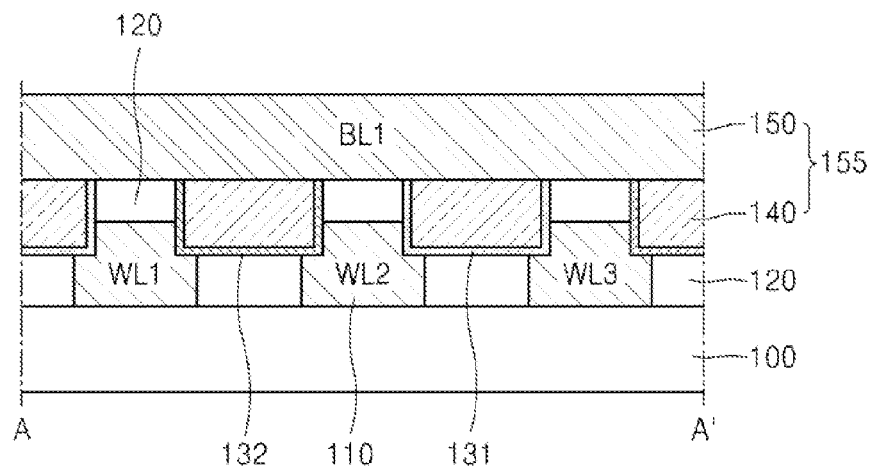
Figure 3C:
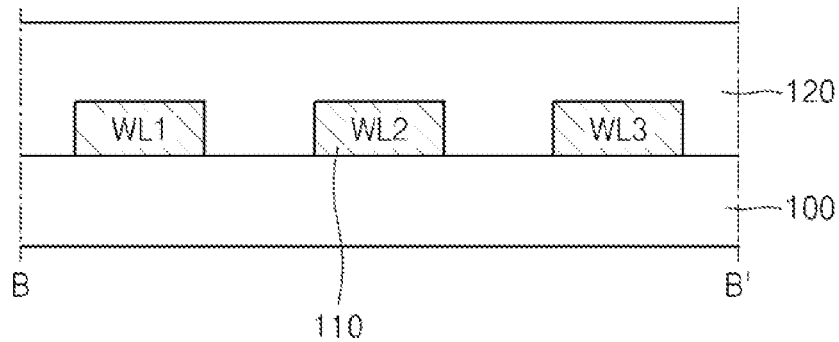
Figure 3D:
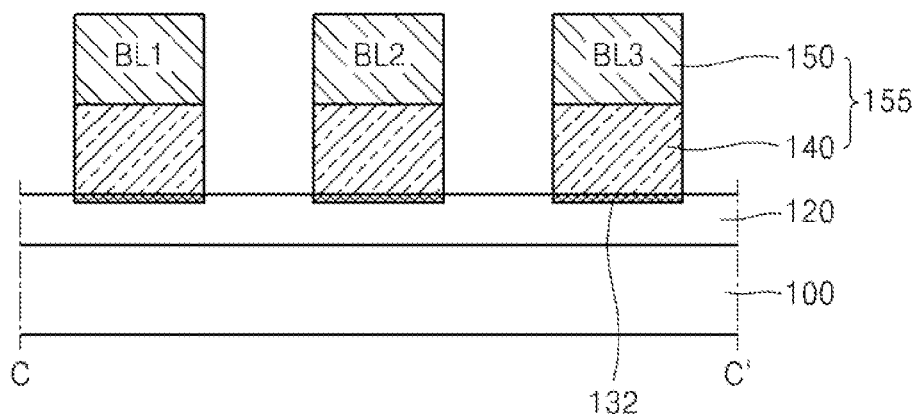
Figure 3E:
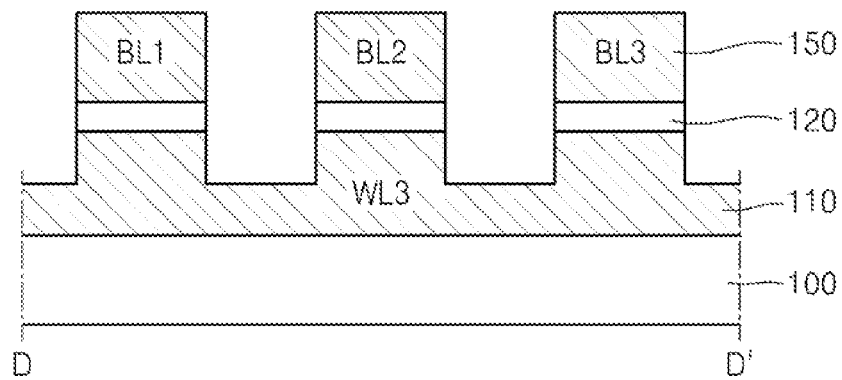

FIG. 3a is a perspective view of a resistive memory array in accordance with a first embodiment of the present invention, FIG. 3b is a cross-sectional view taken along line A-A' of FIG. 3a, FIG. 3c, is a cross-sectional view taken along line B-B' of FIG. 3a, FIG. 3d is a cross-sectional view taken along line C-C' of FIG. 3a, and FIG. 3e is a cross-sectional view taken along line D-D' of FIG. 3a.

Referring to FIG. 3a to FIG. 3e, the resistive memory device in accordance with the first embodiment includes first conductive lines 110 formed in a stripe pattern and arranged at constant intervals on a substrate 100, a first resistance layer 131 connected to one side of each of the first conductive lines 110 and exhibiting resistance variation at a certain voltage, a second resistance layer 132 connected to the other side of each of the first conductive lines 110 and exhibiting resistance variation at a different voltage than the voltage for resistance variation of the first resistance layer 131, and second conductive lines 150 electrically connected to the first and second resistance layers 131, 132 while intersecting the first conductive lines 110 substantially at a right angle.

Each of the first and second resistance layers 131, 132 is connected to upper side surfaces of two adjacent first conductive lines 110, and an interlayer insulation layer 120 is formed between the first conductive lines 110 on the substrate 100 and on the first conductive lines 110 between the first and second resistance layers 131, 132.

Specifically, referring to FIG. 3b, in the resistive memory device according to the first embodiment, a lower electrode composed of the first conductive line 110, the first and second resistance layers 131, 132 disposed at an upper portion of opposite sides of the first conductive line 110, and an upper electrode 155 composed of a conductive pattern 140 and the second conductive line 150 constitute a unit resistive memory cell.

Here, the conductive pattern 140 is disposed between two adjacent first conductive lines 110 under the second conductive line 150. The conductive pattern 140 is placed on the first and second resistance layers 131, 132 and protrudes downwards to a height lower than upper surfaces of the first conductive hues 110, so that a lower surface of the conductive pattern 140 is placed below the upper surfaces of the first conductive lines 110. Each of the first and second resistance layers 131, 132 is interposed between the first conductive, line 110 and the conductive pattern 140. The second conductive line 150 is electrically connected to the first and second resistance layers 131, 132 via the conductive pattern 140.

Each of the first and second resistance layers 131, 132 is connected at one end thereof to the first conductive line 110 and at the other end thereof to the second conductive line 150.

As shown in FIG. 3e, the first conductive lines 110 may have a concave-convex shape in which a convex portion is formed at a region corresponding to the bit lines 150 and a concave portion is formed between the bit lines 150.

Each of the first and second resistance layers 131, 132 is composed of at least one selected from a metal oxide layer, a PCMO ($Pr_{1-x}Ca_xMnO_3$, $0<X<1$) layer, a chalcogenide layer, a perovskite layer, and a metal-doped solid electrolyte layer. Here, the first and second resistance layers 131, 132 are composed of different materials, or composed of the same kind of material with different physical properties, such as a thickness or a contact area with an electrode, to exhibit different resistance variation characteristics at different voltages.

A unit resistive memory cell may include the first conductive line 110, the first resistance layer 131 formed at one side of the first conductive line 110, and the second resistance layer 132 termed at the other side of the first conductive line 110. Therefore, the number of memory cells may be increased to two times in the same area.

In addition, since the first and second resistance layers 131, 132 are configured to exhibit resistance variation at different voltages, a multi-level device may be implemented by allowing two resistive memories to store different data according to the degree of voltage difference between the first conductive line 110 and the conductive pattern 140.

Further, the upper side surface of the first conductive line 110 is partially etched to from a resistive memory on the etched region of the first conductive line 110. When a voltage is applied to the first conductive line 110 for programming, erasing or reading of data, most of the electric field is concentrated on the etched edge of the first conductive line due to current crowding. Thus, an operation of the resistive memory may be performed at a lower voltage. Further, the resistance layer may be formed as small as possible, thereby further allowing the operating voltage to be lowered.

Figure 4A:
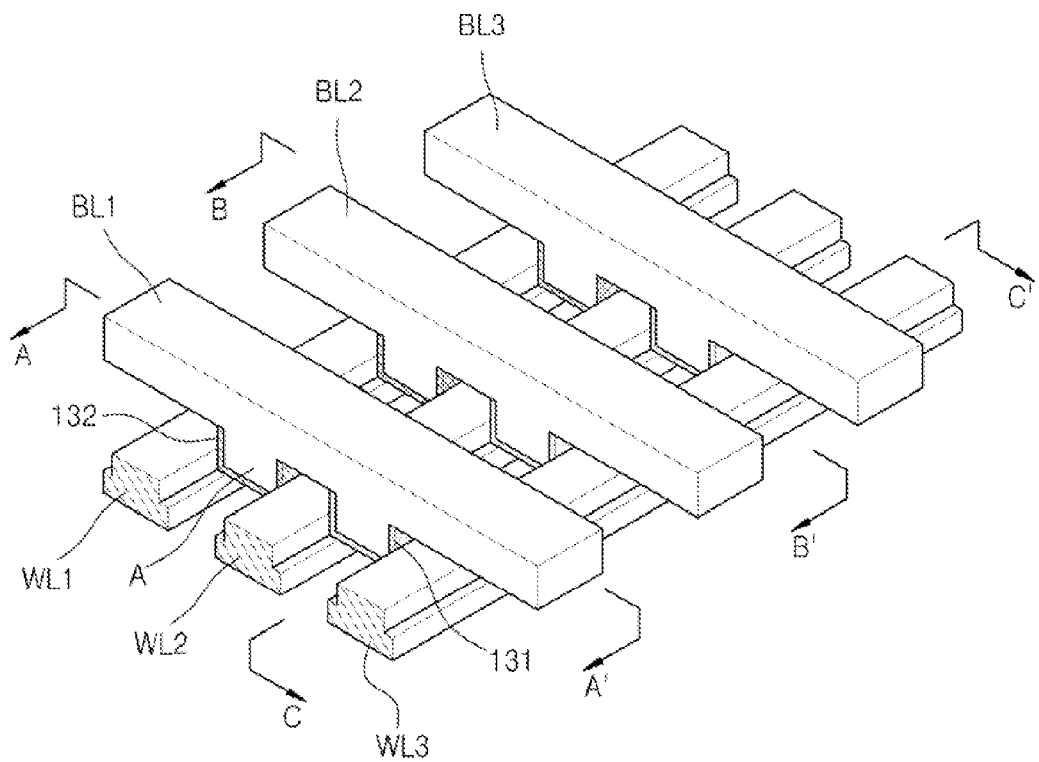
FIG. 4a is a perspective view of a resistive memory array in accordance with a second embodiment of the present invention.
Figure 4B:
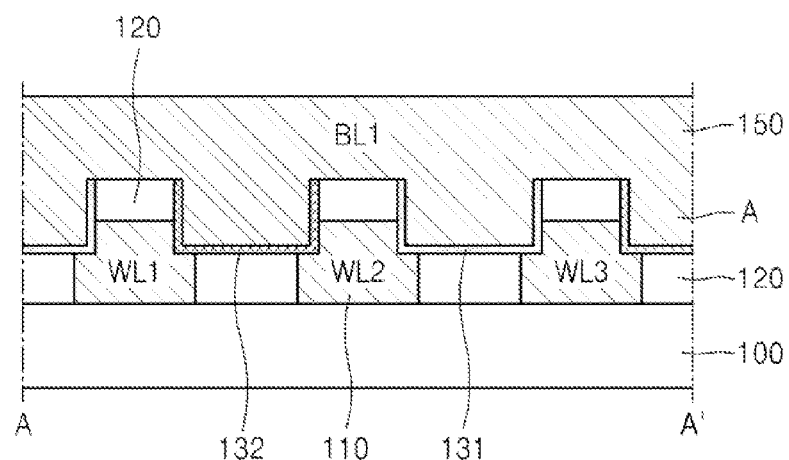
Figure 4C:
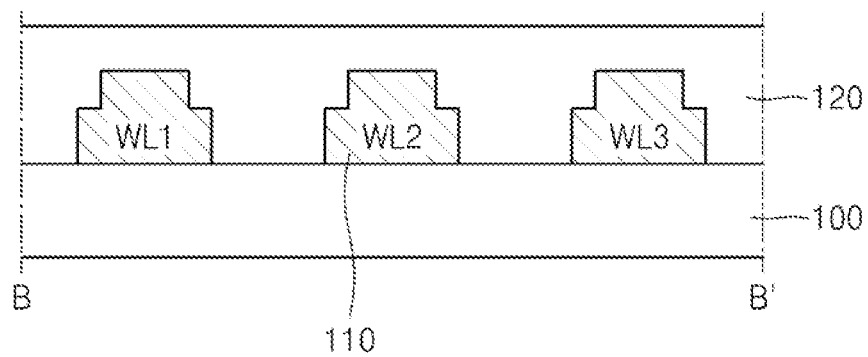
Figure 4D:
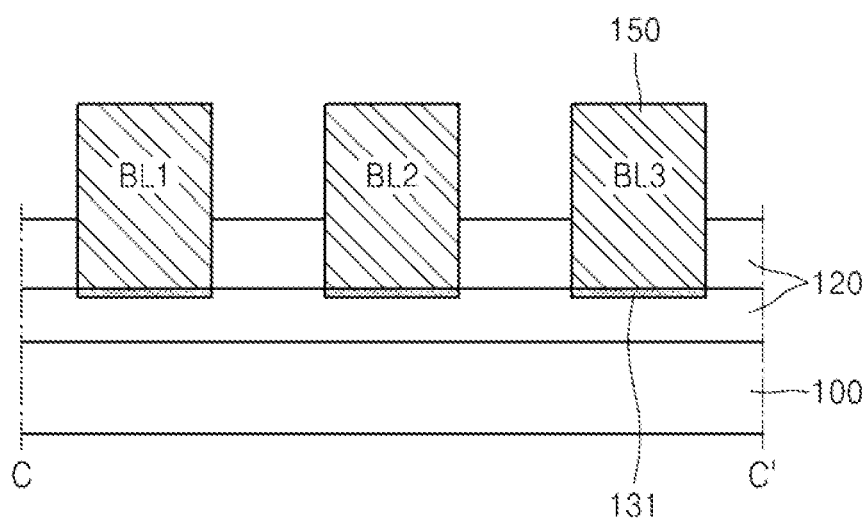

FIG. 4a is a perspective view of a resistive memory array in accordance with a second embodiment of the present invention. FIG. 4b is a cross-sectional view taken along line A-A' of FIG. 4a, FIG. 4c is a cross-sectional view taken along line B-B' of FIG. 4a, and FIG. 4d is a cross-sectional view taken along line C-C' of FIG. 4a.

Referring to FIG. 4a to FIG. 4d, the resistive memory array according to the second embodiment is the same as the resistive memory device shown in FIG. 3a to FIG. 3e except that a lower electrode composed of a first conductive line 110, first and second resistance layers 131, 132 disposed at upper portions of both sides of the first conductive line 110, and an upper electrode composed of a second conductive line 150, which intersects the first conductive line 110 substantially at a right angle and has a protrusion A funned downward to contact the first or second resistance layer 131, 132, constitute a unit resistive memory cell, and that the upper surface of the first conductive line 110 does not have a concave-convex shape. Thus, repeated descriptions of the structure and materials of the resistive memory device according to the second embodiment will be omitted herein. More specifically, the protrusion A is formed on the first and second resistance layers 131, 132 and protrudes do birds to a height lower than the upper surface of the first conductive line 110. Even in this case, the resistive memory device according to the second embodiment has the same effects as the resistive memory device shown in FIG. 3a to FIG. 3e.

Figure 5A:
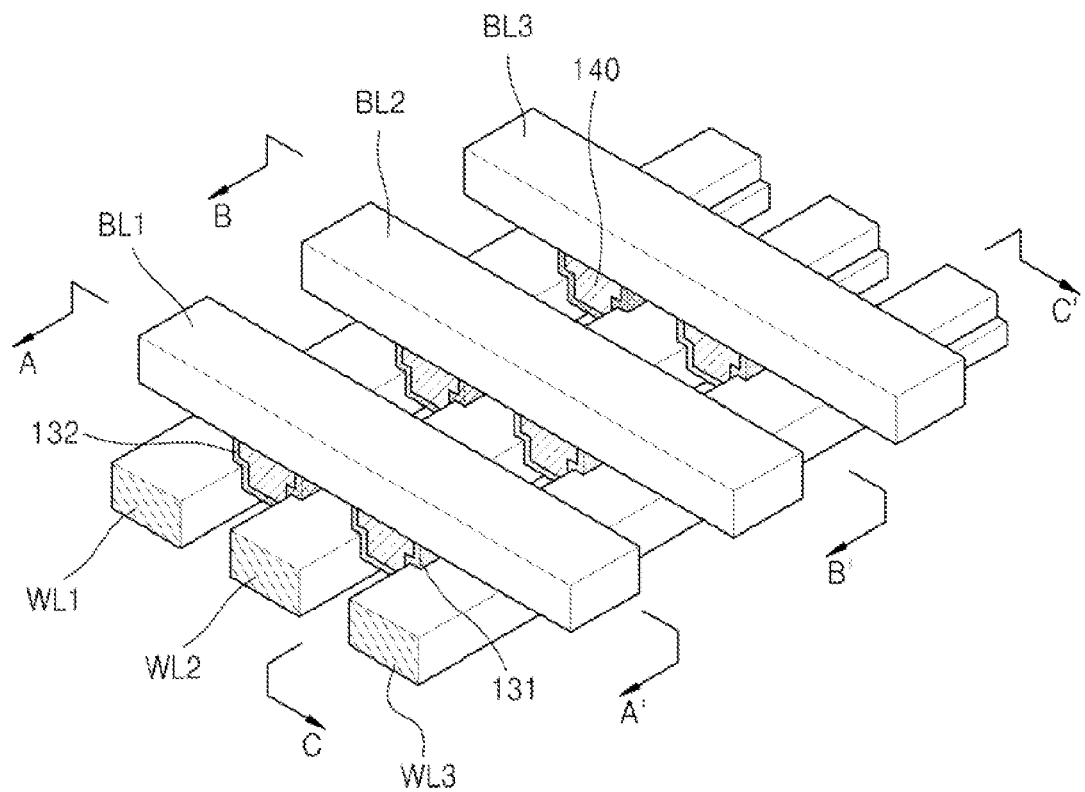
FIG. 5a is a perspective view of as resistive memory array in accordance with a third embodiment of the present invention.
Figure 5B:
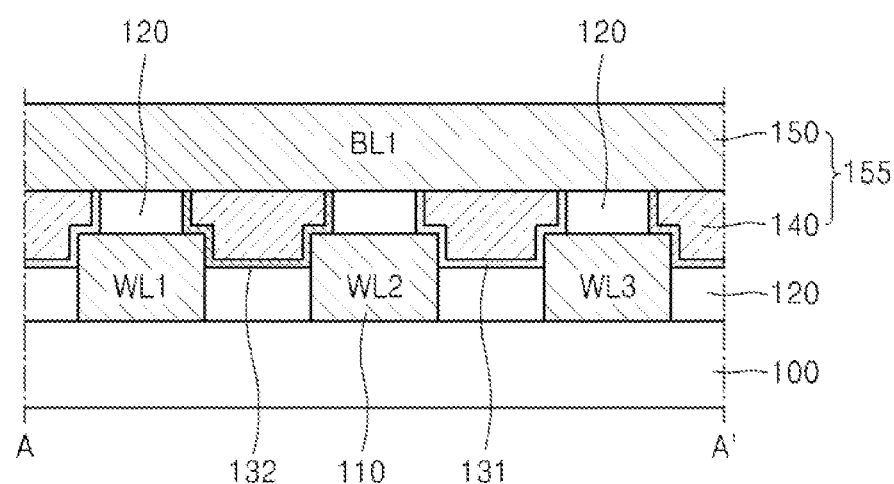
Figure 5C:
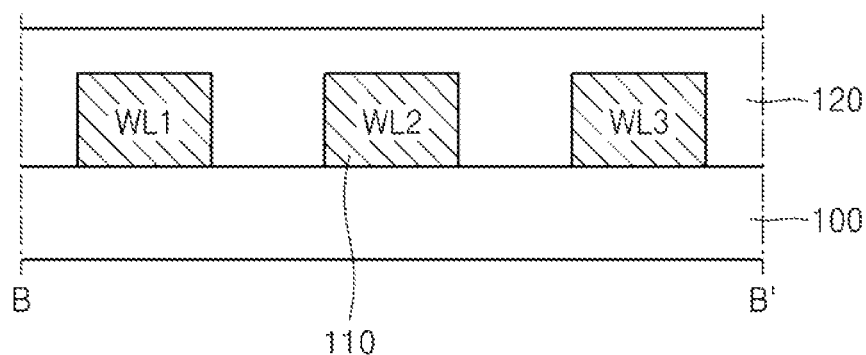
Figure 5D:
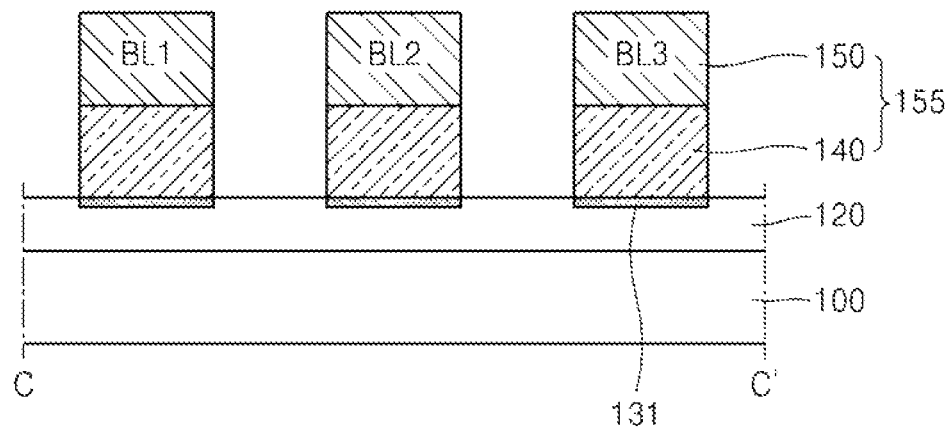

FIG. 5a is a perspective view of a resistive memory array in accordance with a third embodiment of the present invention, FIG. 5b is a cross-sectional view taken along line A-A' of FIG. 5a, FIG. 5c is a cross-sectional view taken along line B-B' of FIG. 5a, and FIG. 5d is a cross-sectional view taken along line C-C' of FIG. 5a.

Referring to FIG. 5a to FIG. 5d, in the resistive memory device according to the third embodiment, a conductive pattern 140 is formed on side surfaces of first conductive lines 110 including upper edges, with first and second resistance layers 131, 132 interposed therebetween, so as to contact second conductive lines 150. Further, the resistive memory device according to the third embodiment is the same as the resistive memory device shown in FIG. 3a to FIG. 3e except that the upper edges of the first conductive lines 110 are not etched, that an upper portion of the conductive pattern 140 has a greater width than a lower portion thereof, and that the upper surfaces of the first conductive lines 110 do not have a concave-convex shape. Thus, repeated descriptions of the structure and materials of the resistive memory device according to the third embodiment will be omitted herein. In this embodiment, since the resistive memory includes the upper edges of the first conductive line 110, an operation of the resistive memory may be performed at a low voltage due to electric field crowding.

On the other hand, in order to allow the conductive pattern 140 to be formed, for example, only on regions corresponding to the second conductive lines 150, elements of the conductive pattern are isolated from each other by a silicon oxide layer, which is interposed therebetween and formed by oxidizing a polysilicon layer for the conductive pattern 140.

Figure 6A:
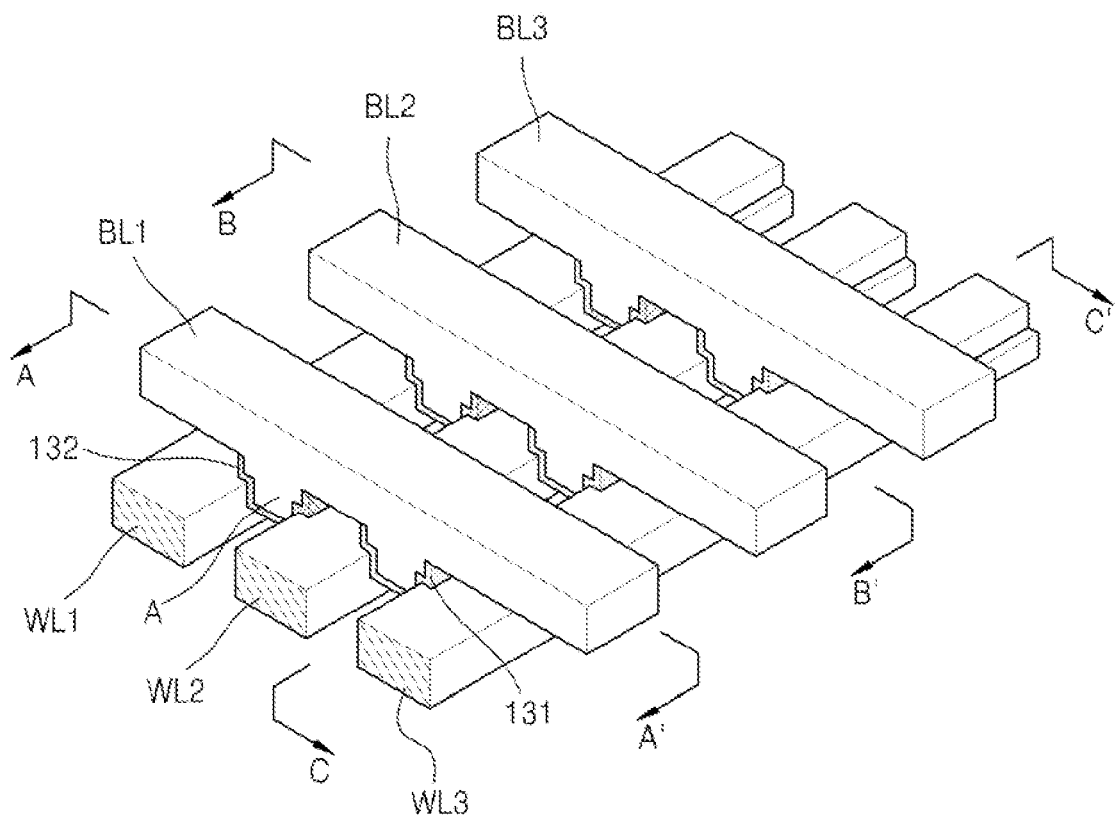
FIG. 6a is a perspective view of a resistive memory array in accordance with a fourth embodiment of the present invention.
Figure 6B:
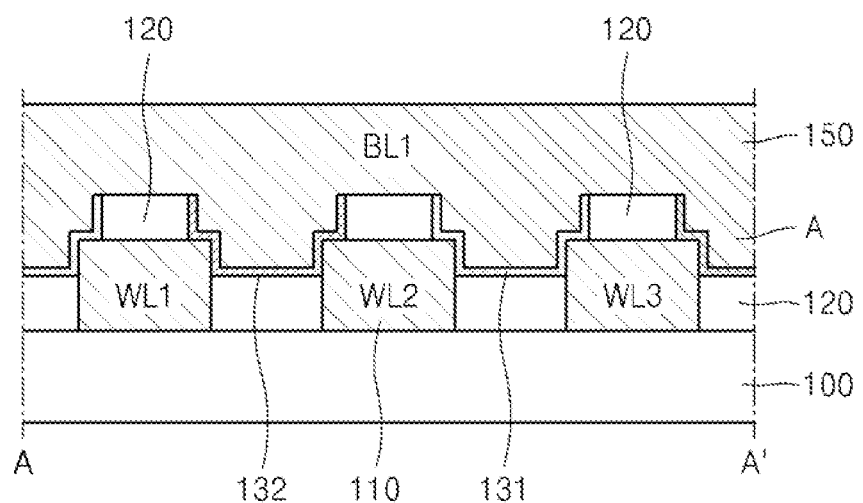
Figure 6C:
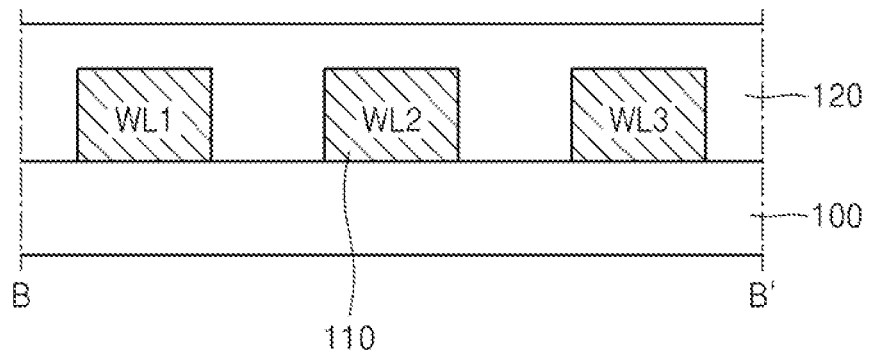
Figure 6D:
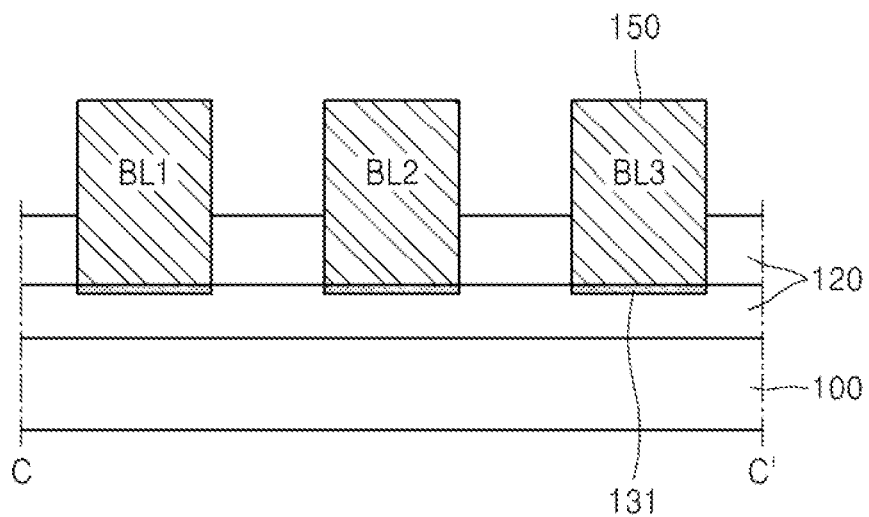

FIG. 6a is a perspective view of a resistive memory array in accordance with a fourth embodiment of the present invention, FIG. 6b is a cross-sectional view taken along line A-A' of FIG. 6a, FIG. 6c is a cross-sectional view taken along line B-B' of FIG. 6a and FIG. 6d is a cross-sectional view taken along line C-C' of FIG. 6a.

Referring to FIG. 6a to FIG. 6d, in the resistive memory array according to the fourth embodiment, first and second resistance layers 131, 132 are respectively disposed on side surfaces of each of first conductive lines 110 including upper edges, and an upper electrode constituted by second conductive lines 150 is disposed to intersect the first conductive lines 110 substantially at a right angle. Here, each of the second conductive lines 150 has a protrusion A, which is formed downwards to be connected to the first and second resistance layers 131, 132 and has a step shape with a width gradually decreasing in a downward direction. The resistive memory device according to the fourth embodiment is the same as the resistive memory device shown in FIG. 3a to FIG. 3e except that the upper edges of the first conductive lines 110 are not etched, the second conductive lines 150 have the step-shaped protrusions A, and the upper surfaces of the first conductive lines 110 do not have a concave-convex shape. Thus, repeated descriptions of the structure and materials of the resistive memory device according to the fourth embodiment will be omitted herein. Specifically the step-shaped protrusion A is formed on the first and second resistance layers 131, 132 and protrudes downwards to a height lower than the upper surface of the first conductive line 110. In this embodiment, since the resistive memory includes the upper edges of the first conductive line 110, an operation of the resistive memory may be at low voltage by relying on electric field crowding.

Figure 7A:
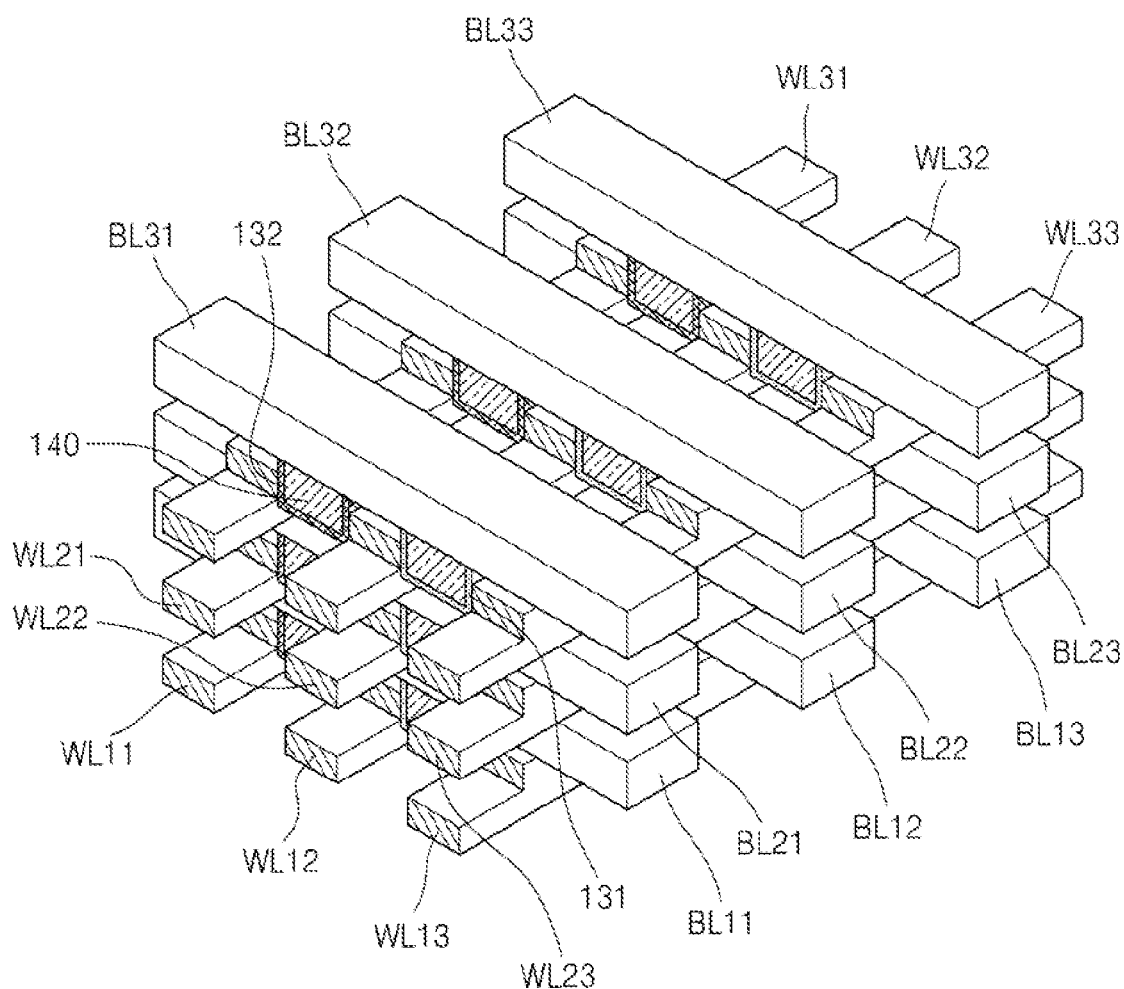
Figure 7C:
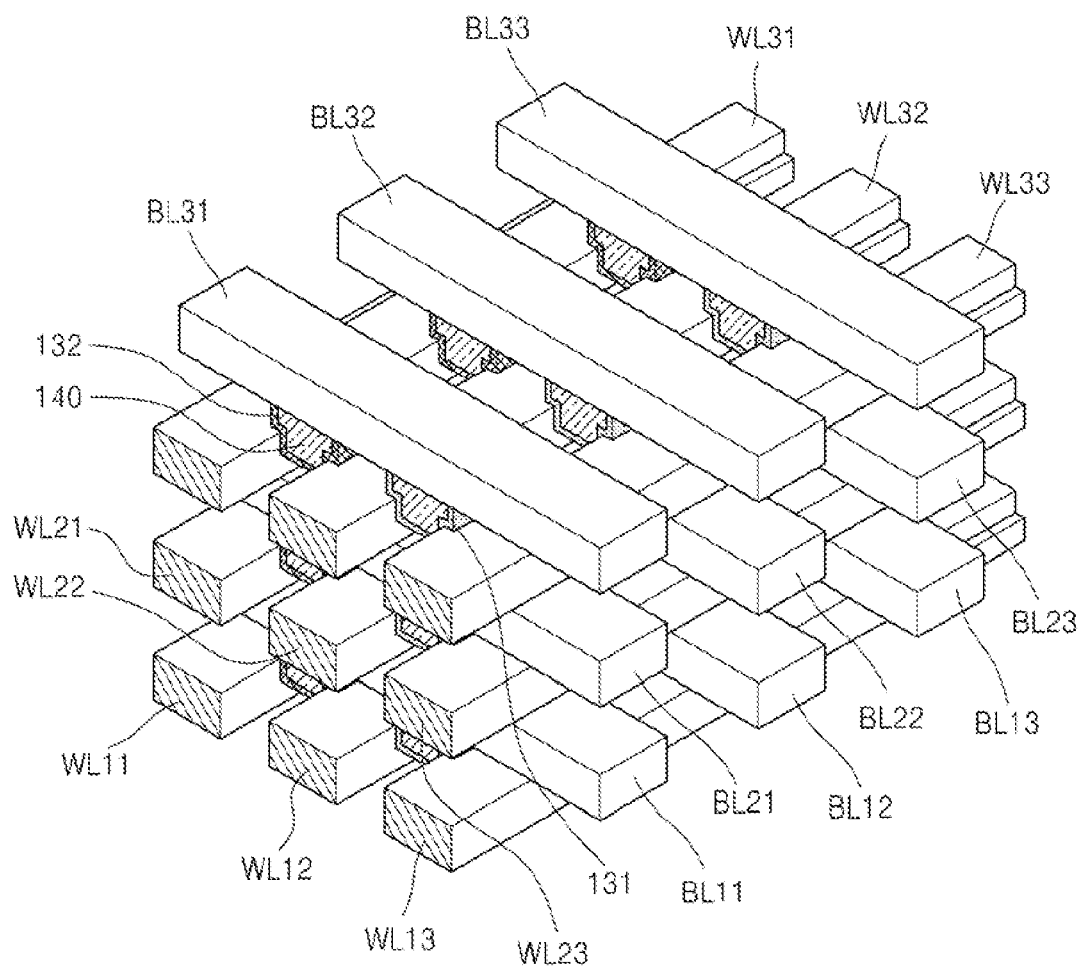

FIG. 7a is a perspective view of a multilayer structure of the resistive memory array shown in FIG. 3a, FIG. 7h is a perspective view of a multilayer structure of the resistive memory array shown in FIG. 4a, FIG. 7c is a perspective view of a multilayer structure of the resistive memory array shown in FIG. 5a, and FIG. 7d is a perspective view of a multilayer structure of the resistive memory array shown in FIG. 6a.

Referring to FIG. 7a, plural unit memory layers, each of which is constituted by the first data lines WL, the second data lines BL, the conductive pattern 140, and the first and second resistance layers 131, 132, are stacked one above another to form a multilayer structure.

More specifically, a first resistive memory layer, a second resistive memory layer, and a third resistive memory layer are vertically stacked to constitute a multilayer memory structure. Here, the first resistive memory layer includes first data lines WL11~WL13, which are disposed parallel to each other and are partially etched at both side edges thereof to have a concave-convex shape, an upper portion of which is narrower than a lower portion thereof, second data lines BL11~BL13 disposed parallel to each other while intersecting the first data lines WL11~WL13 substantially at a right angle, a conductive pattern 140 formed between the first data lines WL11~WL13 of the first resistive memory layer corresponding to the second data lines B11~BL13, and first and second resistance layers 131, 132 interposed, between the respective first data lines WL11~WL13 and the conductive pattern 140. The second resistive memory layer includes first data lines WL21~WL23, second data lines BL21~BL23 disposed parallel to each other while intersecting the first data lines WL21~WL23 substantially at a right angle, a conductive pattern 140 formed between the first data lines WL21~WL23 of the second resistive memory layer corresponding to the second data lines BL21~BL23, and first and second resistance layers 131, 132 interposed between the respective first data lines WL21~WL23 and the conductive pattern 140. The third resistive memory layer includes first data lines WL31~WL33, second data lines BL31~BL33 disposed parallel to each other while intersecting the first data lines WL31~WL33 substantially at a right angle, a conductive pattern 140 formed between the first data lines WL31~WL33 of the third resistive memory layer corresponding to the second data lines BL31~BL33, and first and second resistance layers 131, 132 interposed between the respective first data lines WL31~WL33 and the conductive pattern 140. Here, each of the first and second resistance layers 131, 132 is connected at one end thereof to the first data lines WL11~WL33 and at the other end thereof to the second data lines BL11~BL33.

Referring to FIG. 7b, plural unit memory layers are stacked one above another to form a multilayer structure. Here, each of the unit memory layers is constituted by the first data lines WL, the second data lines BL each having a protrusion A in a downward direction, and the first and second resistance layers 131, 132. The protrusion A is placed on the first and second resistance layers 131, 132 and protrudes downwards to a height lower than the upper surfaces of the first conductive lines 110. This multilayer structure is the same as that shown in FIG. 7a except that the second data lines RI have the protrusions A contacting the first or second resistance layer 131 or 132 and the first data lines WL do not have a concave-convex shape as shown in the conductive pattern shown in FIG. 7a. Thus, descriptions of repeated elements will be omitted herein.

Referring to FIG. 7c, plural unit memory layers are stacked one above another to form a multilayer structure. Here, each of the unit memory layers is constituted by the first data lines WL, the second data lines BL, the conductive pattern 140 overlapping opposite edges of each of the first data lines WL and having an upper portion wider than a lower portion thereof, and the first and second resistance layers 131, 132. This multilayer structure is the same as that shown in FIG. 7a except that the upper and lower portions of the first data lines WL have the same width, the conductive pattern 140 has a "T"-shape, an upper portion of which has a greater width than a lower portion thereof, and the first data lines WL do not have a concave-convex shape. Thus, descriptions of repeated elements will be omitted herein.

Referring to FIG. 7d, plural unit memory layers are stacked one above another to form a multilayer structure. Here, each of the unit memory layer is constituted by the first data lines WL, the second data lines BL each having, a protrusion A, which is formed downwards to overlap both edges of each of the first data lines WL, and has an upper portion wider than a lower portion thereof, and the first and second resistance layers 131, 132. The protrusion A is placed on the first and second resistance layers 131, 132 and protrudes downwards to a height lower than the upper surfaces of the first conductive lines 110. This multilayer structure is the same as that shown in FIG. 7a except that the upper and lower portions of the first data lines WL have the same width, that the protrusions A of the second data lines WL are formed in a "T"-shape, an upper portion of which has a greater width than a lower portion thereof, instead of forming the conductive pattern shown in FIG. 7a, and that the first data lines WL does not have a concave-convex shape. Thus, descriptions of repeated elements will be omitted herein.

As shown in FIG. 7a to FIG. 7d, the multilayer resistive memory formed by stacking the plural unit resistive memory layers one above another may be used to store large amounts of data.

Figure 10:
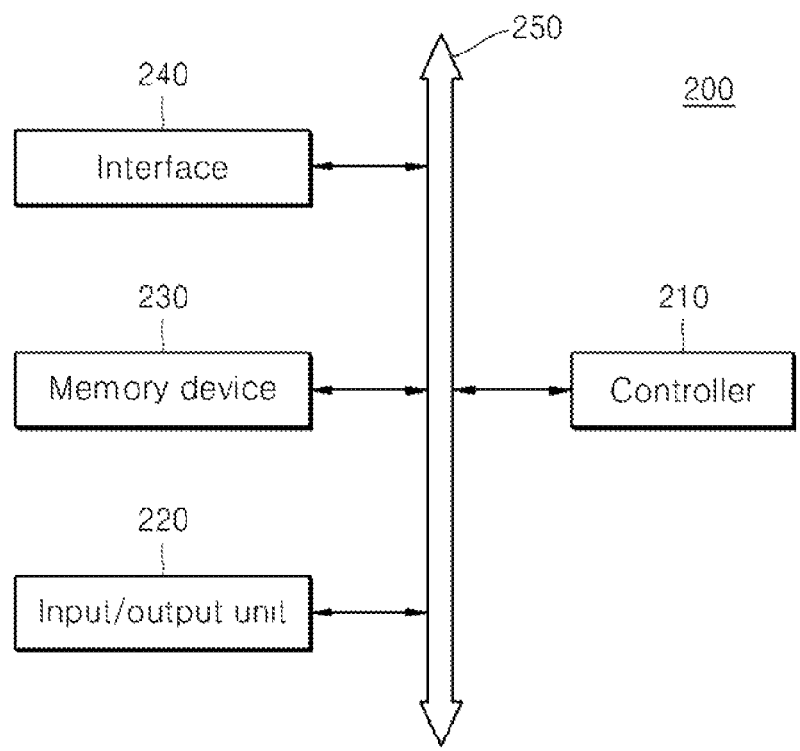
FIG. 10 is a block diagram of one example of an electronic system including a resistive memory in accordance with an exemplary embodiment of the present invention.

FIG. 10 is a block diagram of one example of an electronic system including a resistive memory in accordance with an exemplary embodiment of the present invention.

Referring to FIG. 10, the electronic system 200 may include a controller 210, an input/output unit 220, and a memory device 230. The controller 210, the input/output unit 220 and the memory device 230 may be coupled via a bus 250.

The bus 250 acts as a passage of data and/or operating signals.

The controller 210 may include at least one selected from a microprocessor, a digital signal processor, a microcontroller, and other logic devices capable of performing a function thereof.

The input/output unit 220 may include at least one selected from a keypad, a keyboard, a display device, and the like.

The memory device 230 stores data and/or instructions implemented by the controller 210. The memory device 230 may include the resistive memory devices according to the embodiments as described above.

The electronic system 200 may further include an interface for transferring data to a communication network or receiving data therefrom. The interface 240 may be realized in a wired or wireless manner. For example, the interface 240 may include an antenna, a wired/wireless transceiver, or the like.

The electronic system 200 may be realized by a mobile system, a personal computer, an industrial computer or a system for performing other functions. For example, the mobile system may include personal digital assistants (PDAs), portable computers, web tablets, mobile phones, wireless phones, laptop computers, memory cards, digital music systems, information transferring/receiving systems, and the like. If the electronic system 200 can perform wireless telecommunication, the electronic system 200 may be used in an interface protocol of a third generation telecommunication system, such as CDMA, GSM, NADC, E-TDMA, WCDMA, and CDMA2000.

Figure 11:
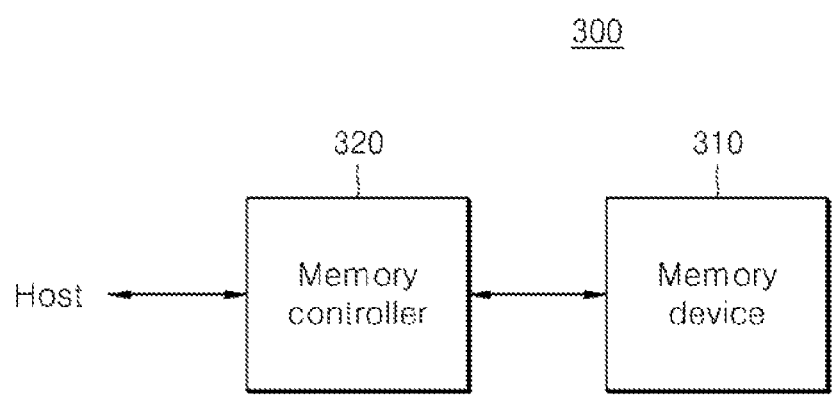
FIG. 11 is a block, diagram of one example of a memory card including a resistive memory in accordance with an exemplary embodiment of the present invention.

FIG. 11 is a block diagram of an exemplary memory card including a resistive Memory in accordance with an exemplary embodiment of the present invention.

The memory card 300 includes a memory device 310 and a memory controller 320.

The memory device 310 may store data. The memory device may exhibit nonvolatile characteristics and maintain stored data even in the case of power stoppage. The memory device 310 may include a Memory device in accordance with the embodiments of the invention described above.

The memory controller 320 may control the memory device 310 to store data or to read stored data in response to a read/write request from a host.

Method of Fabricating Resistive Memory Cell

Embodiment 1

FIG. 12 to FIG. 18 are cross-sectional views of a method of fabricating the resistive memory device in accordance with the first or second embodiment.

For illustration purposes, a memory device, which includes first to third word lines WL1, WL2, WL3, a first bit line BL1 perpendicular to the word lines WL1, WL2, WL3, and a conductive pattern 140 disposed between the respective word lines WL1, WL2, WL3 under the first bit line BL1, will be described in the layout diagram of FIG. 2. The same reference numerals as those in FIG. 3a to FIG. 3e indicate the same elements.

Figure 12:
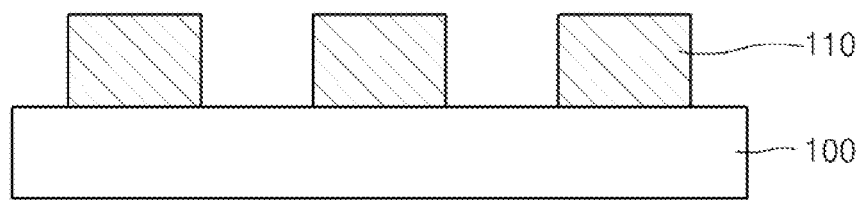
FIG. 12 to FIG. 18 are cross-sectional views of a method of fabricating the resistive memory device in accordance with the first or second embodiment of the present invention.

Referring to FIG. 12, a lower electrode 110 is formed on a semiconductor substrate 100.

Before forming the lower electrode 110, a process of forming transistors constituting a peripheral circuit on the semiconductor substrate 100 and an insulation layer (not shown) is performed on the peripheral circuit.

The lower electrode 110 is a conductive layer which becomes word lines WL of a memory array. The lower electrode 110 may be formed through deposition of at least one selected from metal electrode materials including metals, such as tungsten (W), aluminum (Al), copper (Cu), gold (Au), silver (Ag), platinum (Pt), nickel (Ni), cobalt (Co), chromium (Cr), titanium (Ti), ruthenium (Ru), hafnium (Hf), or zirconium (Zr), or alloys thereof, nitride electrode materials including a metal nitride such as titanium nitride (TiN), tantalum nitride (TaN), tungsten nitride (WN), and the like; and oxide electrode materials including $In_2O_3$:Sn (ITO), $SnO_2$:F (FTO)), $SrTiO_3$, $LaNiO_3$, and the like.

The electrode material may be deposited through, for example, physical vapor deposition, chemical vapor deposition, sputtering, pulsed laser deposition, thermal evaporation, electron beam evaporation, atomic layer deposition or molecular beam epitaxy.

The deposited conductive layer is subjected to photolithography in a pattern of stripes separated at constant intervals in a first direction and disposed parallel to each other, as shown in FIG. 2.

Figure 13:
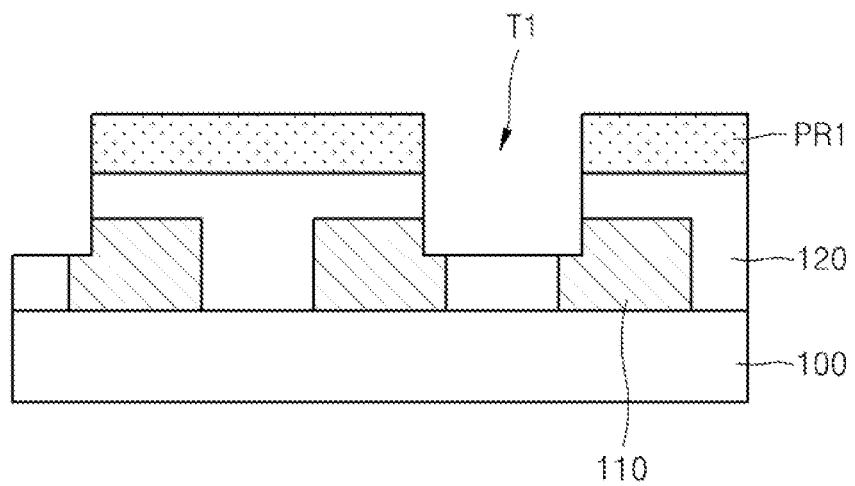

Referring to FIG. 13, an interlayer insulation layer 120 is formed on the semiconductor substrate 100 which has the lower electrode 110 formed thereon, by depositing an insulation layer such that the lower electrode 110 can be buried in the insulation layer. The interlayer insulation layer 120 may be formed of a material (such as silicon oxide ($SiO_2$), silicon nitride (SiN), or the like) which is generally used to form the interlayer insulation layer.

The interlayer insulation layer 120 may be deposited to a desired thickness on the lower electrode while burying a space between the lower electrodes 110. After forming the interlayer insulation layer 120, the surface of the interlayer insulation layer 120 may be flattened for subsequent photolithography.

Subsequently, a photoresist is deposited on the interlayer insulation layer 120, followed by exposure and development to form a first photoresist pattern PR1 which defines a region on which a conductive line for forming a conductive pattern 140 (see FIG. 2) will be formed. The conductive line for the conductive pattern 140 (see FIG. 2) will be formed on a region on which the first photoresist pattern PR1 is open.

In this embodiment, in order to form the conductive line for the conductive pattern 140 (see FIG. 2), the first photoresist pattern PR1 is formed such that parts of side surfaces of the second and third word lines WL2, WL3 and the interlayer insulation layer 120 between these word lines WL2, WL3 in FIG. 2 can be exposed.

Subsequently, the interlayer insulation layer 120 and the lower electrode 110 are subjected to anisotropic etching through the first photoresist pattern PR1 used as a mask such that one side of the lower electrode 110 can be partially etched. As a result, a first trench T1 is formed between two adjacent word lines to expose part of the one side of the lower electrode 110 and the interlayer insulation layer 120 between the two adjacent word lines. Here, in order to place resistance variation memories exhibiting different electrical characteristics at opposite sides of the lower electrode 110, the lower electrode 110 is etched, for example, only at one side thereof, and etching is performed to allow two adjacent lower electrodes to face each other, as shown in the figures.

Etching of the side of the lower electrode 110 may be performed by any well-known process. For example, the interlayer insulation layer 120 is etched through the first photoresist pattern PR1 used as a mask to expose a desired thickness of the lower electrode 110, followed by additional etching of the lower electrode 110 such that the lower electrode 110 can be partially etched. Alternatively, although not shown in the figures, in the process of forming the lower electrode 110, a dual damascene process generally used as a multilayer conductive line process is used to form the lower electrode 110, the side surface of which is partially etched.

In this way, the resistive memory constituted by the lower electrode, the resistance layer, and the conductive layer is formed on the one side of the lower electrode 110 by sequentially forming the resistance layer and the conductive layer on the etched portion of the one side of the lower electrode 110 in subsequent processes.

Figure 14:
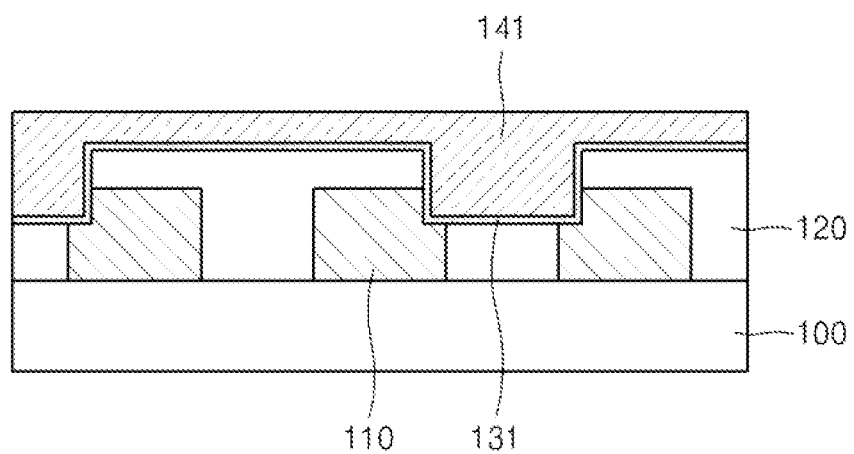

Referring to FIG. 14, after removing the first photoresist pattern PR1 (see FIG. 13), a first resistance layer 131 of the resistive memory is formed along an inner wall of the first trench T1 on the overall surface of the resultant structure.

The first resistance layer 131 may be a transition metal oxide layer, a chalcogenide layer, a perovskite layer, or a metal-doped solid electrolyte layer.

The transition metal oxide layer may be formed of a binary oxide comprising a transition metal oxide (TMO) such as $SiO_2$, $Al_2O_3$ or nickel oxide, titanium oxide, tantalum oxide, aluminum oxide, zirconium oxide, niobium oxide, tungsten oxide, cobalt oxide, hafnium oxide, copper oxide, zinc oxide, and the like. For example, the binary oxide may be $HfO_{2-X}$, $ZrO_{2-X}$, $Y_2O_{3-X}$, $TiO_{2-X}$, $NiO_{1-Y}$, $Nb_2O_{5-X}$, $Ta_2O_{5-X}$, $CuO_{1-Y}$, $Fe_2O_{3-X}$ ($0 \leq x \leq 1.5$, $0 \leq y \leq 0.5$), or a lanthanide oxide layer. Lanthanides may include lanthanum (La), cerium (Ce), praseodymium (Pr), neodymium (Nd), samarium (Sm), gadolinium (Gd), or dysprosium (Dy).

The chalcogenide layer may be formed of a chalcogenide based material such as GST (GeSbTe) in which germanium (Ge), antimony (Sb) and tellurium (Te) are combined in a desired ratio.

The perovskite layer may be formed of a perovskite-based material such as STO ($SrTiO_3$). PCMO ($Pr_{1-x}Ca_xMnO_3$), and the like. Alternatively, the perovskite layer may be as Cr or Nb-doped $SrZrO_3$ layer.

Further, the metal-doped solid electrolyte layer may be an Ag-doped GeSe layer, that is, an AgGeSe layer.

The space between the lower electrodes 110 is a narrow region having a high aspect ratio. However, when the first resistance layer 131 is formed by depositing a resistive material, the space between the lower electrodes 110 can be blocked by the resistive material. Thus, in order to secure a space for forming the conductive line fin the conductive pattern 140 (see FIG. 2), which will be formed in a subsequent process, the first resistance layer 131 may be subjected to additional etching. Additional etching of the first resistance layer 131 may secure, for example, not only the region on which the conductive line for the conductive pattern 140 (see FIG. 2) can be stably formed, but also improved switching characteristics of the resistors. As such, when the first resistance layer 131 is etched, the amount of oxygen vacancies increases in the etched region, thereby improving switching characteristics of the resistive memory.

Next, a conductive, material is deposited on the first resistance layer 131 to form a first conductive layer 141 for forming the conductive line for the conductive pattern 140 (see FIG. 2).

Like the lower electrode 110, the first conductive layer 141 may be formed by depositing a conductive material such as metal or polysilicon through chemical vapor deposition or the like. The first conductive layer 141 serves to connect an upper electrode, which will be formed later, to another element.

After forming the first conductive layer 141, the surface of the first conductive layer 141 is subjected to flattening for a subsequent photolithography process.

Figure 15:
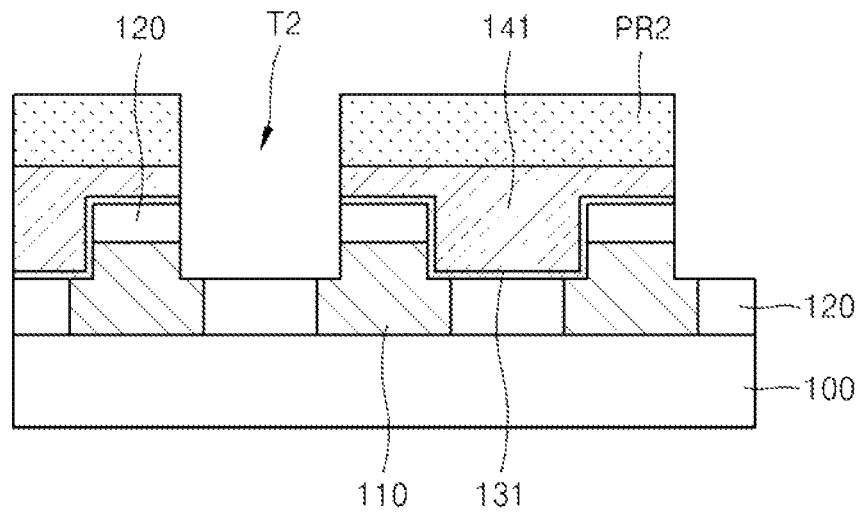

Referring to FIG. 15, a photoresist is deposited on the first conductive layer 141, followed by exposure and development to form a second photoresist pattern PR2. The second photoresist pattern PR2 serves to define part of the conductive line for the Conductive pattern 140 (see FIG. 2). In this embodiment, the second photoresist pattern is formed such that parts of side surfaces of the first and second word lines WL1, WL2 and the first conductive layer 141 between these word lines WL1, WL2 in the layout diagram of FIG. 2 can be exposed.

For this purpose, the first resistance layer 131, the interlayer insulation layer 120 and the lower electrode 110 under the exposed first conductive layer 141 and the exposed first conductive layer 141 are subjected to anisotropic etching using the second photoresist pattern PR2 as a mask. As a result, a second trench T2 is formed between two adjacent word lines to expose part of the other side of the lower electrode 110 and the interlayer insulation layer 120 between the two adjacent word lines. The first and second trenches T1, T2 are alternately arranged and parallel to each other. When etching the lower electrode 110 the upper side surface of the lower electrode is partially etched such that the side surfaces of two adjacent lower electrodes 110 face each other.

Figure 16:
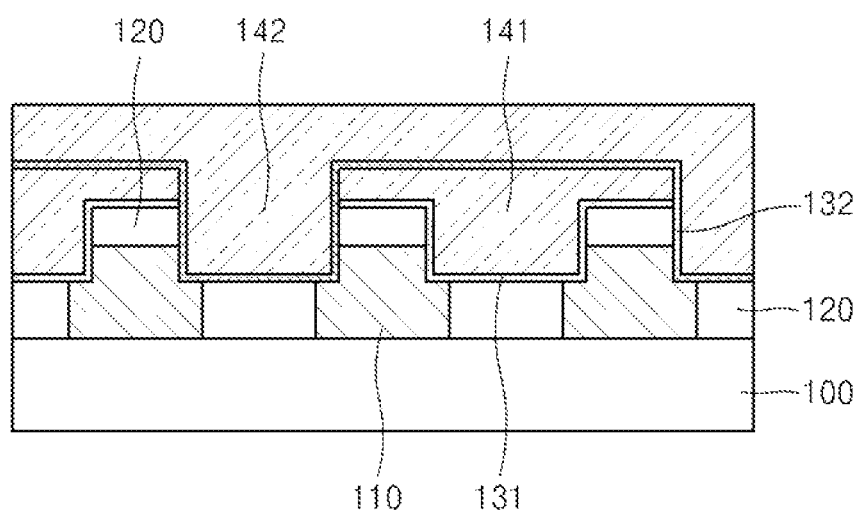

Referring to FIG. 16, after removing, the second photoresist pattern PR2 (see FIG. 13), a second resistance layer 132 of the resistive memory is formed along an inner wall of the second trench 12 on the overall surface of the resultant structure. The second resistance layer 132 may be formed by the same process as that of the first resistance layer 131. For example, the second resistance layer 132 may be formed by depositing one of a transition metal oxide layer, a chalcogenide layer, a perovskite layer, and a metal-doped solid electrolyte layer through as typical deposition process.

Like the forming of the first resistance layer 131, a resistive material is deposited to form the second resistance layer 132, followed by etching the deposited resistive material in order to secure a space for stably forming the second conductive layer and to improve switching characteristics.

The second resistance layer 132 is formed to exhibit different resistance characteristics from those of the first resistance layer 131. For example, in order to exhibit different resistance characteristics from those of the first resistance layer 131, the second resistance layer 132 may be composed of different materials than the first resistance layer 131 or of the same kind of material with different properties, such as different thicknesses or different sized of contact areas with an electrode, than the first resistance layer 131. Since one lower electrode 110 is formed at opposite sides thereof with two resistance layers 131, 132, two resistive memories are provided for one word line. This configuration can be obtained by forming two resistance layers exhibiting different resistance variation characteristics, that is two resistance layers 131, 132 exhibiting resistance variation at different voltages.

After forming the second resistance layer 132, a second conductive layer 142 is formed over the surface thereof. The second conductive layer 142 may be formed of the same or different material than the first conductive layer 141. Like the first conductive layer 141, the second conductive layer 142 may be formed by depositing any known electrode material, such as a metal, through a typical deposition process.

Figure 17:
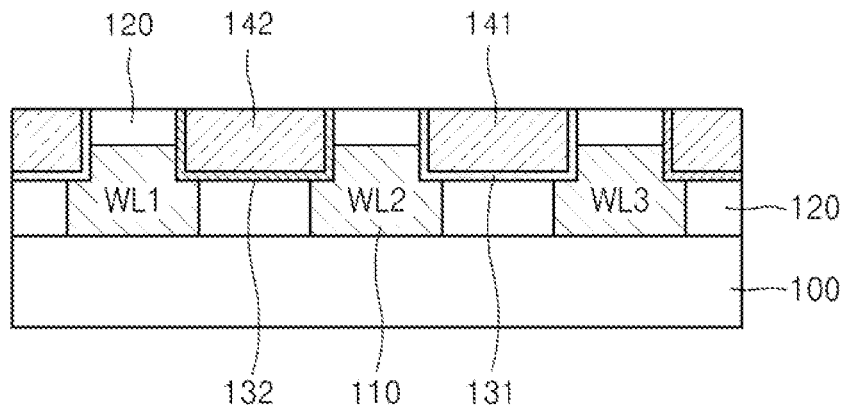

Referring to FIG. 17, the second conductive layer 142, the second resistance layer 132, the first conductive layer 141, and the first resistance layer 131 are subjected to anisotropic etching such that the first and second conductive layers 141, 142 can be separated from each other in a pattern of stripes. The anisotropic etching may be performed by chemical mechanical polishing (CMP), which is a well-known flattening process.

The CMP process fir the second conductive layer 142, the second resistance layer 132, the first conductive layer 141, and the first resistance layer 131 may be performed until the upper surface of the interlayer insulation layer 120 is exposed, such that the first and second conductive layers 141, 142 can be separated from each other in a pattern of stripes.

Figure 18:
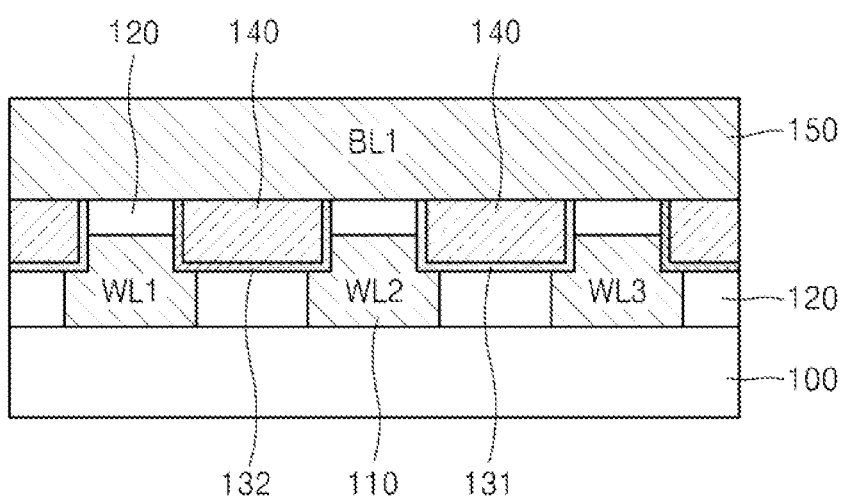

Referring to FIG. 18, after forming the conductive layer (not shown) by depositing a conductive material on the overall surface of the resultant structure, bit lines 150 are formed by patterning the conductive layer in a stripe pattern to intersect the lower electrode 110, which will act as word lines.

The bit lines 150 may be formed by patterning the conductive layer to intersect the lower electrode 110 using a mask such as a PR pattern (not shown). The mask is removed after forming the bit lines 150.

When forming the bit lines 150, the first and second conductive layers 141, 142 (see FIG. 17) corresponding to the space between the bit lines 150 are etched.

Here, the first and second conductive layers 141, 142 may be subjected to wet etching which has higher etching selectivity (etching rate) with respect to the first and second conductive layers 141, 142 than the bit lines 150.

As a result, the conductive pattern 140 composed of the first or second conductive layer 141 or 142 is formed between the word lines in regions corresponding to the bit lines 150. In this way, elements of the conductive pattern 140 are disconnected from each other.

Further, during etching for forming the conductive pattern 140, the word lines between the bit lines 150 may be partially etched. In this case, the word lines may be formed in a concave-convex shape in which a convex portion is formed in a region corresponding to the bit line 150 and a concave portion is formed between the hit lines 150.

Method of Fabricating Resistive Memory Cell

Embodiment 2

In FIG. 18, when the first and second conductive layers 141, 142 are formed of polysilicon, the first and second conductive layers 141, 142 corresponding to the space between the bit fines 150 are oxidized instead of etching the first and second conductive layers after forming the bit lines 150.

Since the first and second conductive layers 141, 142 corresponding to the space between the bit lines 150 are formed of a silicon oxide layer, the conductive pattern 140 is formed, for example, only between the word lines corresponding to the bit lines 150. As a result, the elements of the conductive pattern 140 are disconnected from each other.

Formation of the remaining lower electrode 110, first and second resistance layers 131, 132 and bit line 150 may be the same as in the first embodiment described above and a detailed description thereof will thus be omitted herein.

Method of Fabricating Resistive Memory Cell

Embodiment 3

FIG. 19 to FIG. 25 are cross-sectional views of a method of fabricating the resistive memory device in accordance with the third embodiment of the present invention.

For illustration purposes, a memory device, which includes first to third word lines WL1, WL2, WL3 and a first bit line BL1 perpendicular to the word lines WL1, WL2, WL3, will be described in the layout diagram of FIG. 2. The same reference numerals as those in FIG. 3a to FIG. 3e indicate the same elements.

Figure 19:
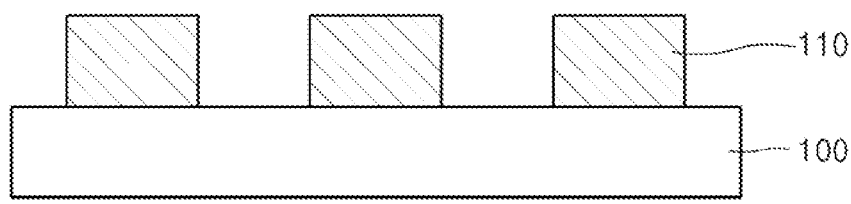
FIG. 19 to FIG. 25 are cross-sectional views of as method of fabricating the resistive memory device, in accordance with the third embodiment of the present invention.

Referring to FIG. 19, a lower electrode 110 is formed on a semiconductor substrate 100 in a pattern of stripes separated at constant intervals in a first direction and disposed parallel to each other.

Figure 20:
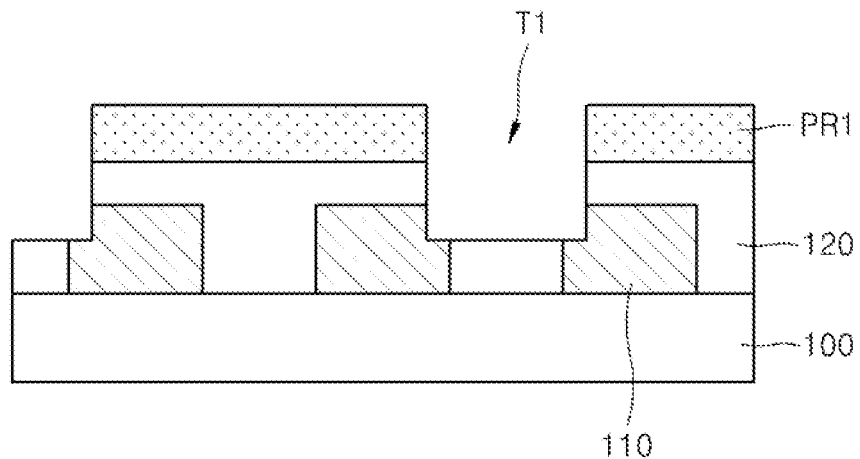

Referring to FIG. 20, an inter layer insulation layer 120 is formed on the semiconductor substrate 100, which has the lower electrode 110 formed thereon, by depositing an insulation layer such that the lower electrode 110 can be buried in the insulation layer.

Next, the interlayer insulation layer 120 and pan of one side of the lower electrode 110 are subjected to anisotropic etching through the first photoresist pattern PR1 used as a mask, which defines a region for forming the conductive line for the conductive pattern 140 (see FIG. 2), such that a first trench T1 is formed between two adjacent word lines WL2, WL3 to expose the part of the one side of the lower electrode 110 and the interlayer insulation layer 120 between the two adjacent word lines WL2, WL3.

Figure 21:
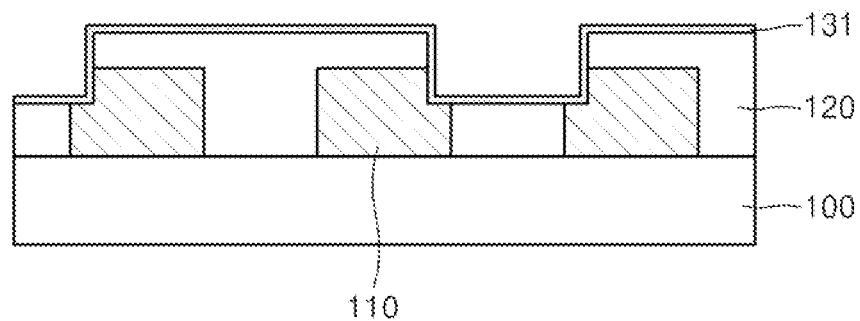

Referring to FIG. 21, after removing the first photoresist pattern PR1 (see FIG. 20), a first resistance layer 131 of the resistive memory is formed along an inner wall of the first trench T1 on the overall surface of the resultant structure.

After forming the first resistance layer 131, the first resistance layer 131 may be subjected to additional etching to remove the first resistance layer 131 to a desired thickness in order to secure a space between two lower electrodes 110 while improving switching characteristics of the resistors through an increase in the amount of oxygen vacancies.

Since the materials and formation of the lower electrode 110, the interlayer insulation layer 120, the first photoresist pattern PR1, the first trench T1 and the first resistance layer 131 shown in FIG. 19 to FIG. 21 are the same as those of the first embodiment shown in FIG. 12 to FIG. 14, a repeated description thereof will be omitted herein.

Figure 22:
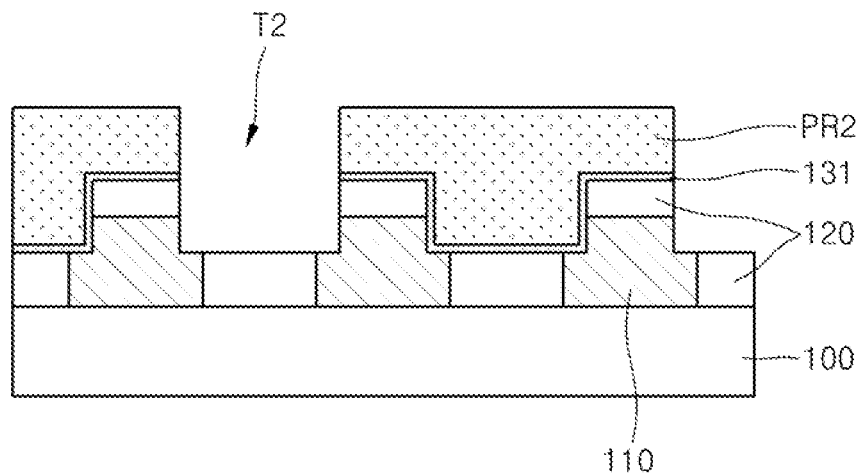

Referring to FIG. 22, a photoresist is deposited on the first resistance layer 131, followed by exposure and development to form a second photoresist pattern PR2, which will define a region on which the conductive line for the conductive pattern 140 (see FIG. 2) will be formed.

Next, the interlayer insulation layer 120 and part of the other side of the lower electrode 110 are subjected to anisotropic etching using the second photoresist pattern PR2 as a mask. As a result, a second trench T2 is formed between two adjacent word lines WL1, WL2 to expose part of the other side of the lower electrode 110 and the interlayer insulation layer 120 between the two adjacent word lines WL1, WL2. The first and second trenches T1, T2 are alternately arranged and parallel to each other.

In order to place resistance variation memories exhibiting different electrical characteristics at opposite sides of the lower electrode 110, the lower electrode 110 is etched, for example, only at the other side thereof, and etching is performed to allow two adjacent lower electrodes 110 to face each other, as shown in the figures.

Figure 23:
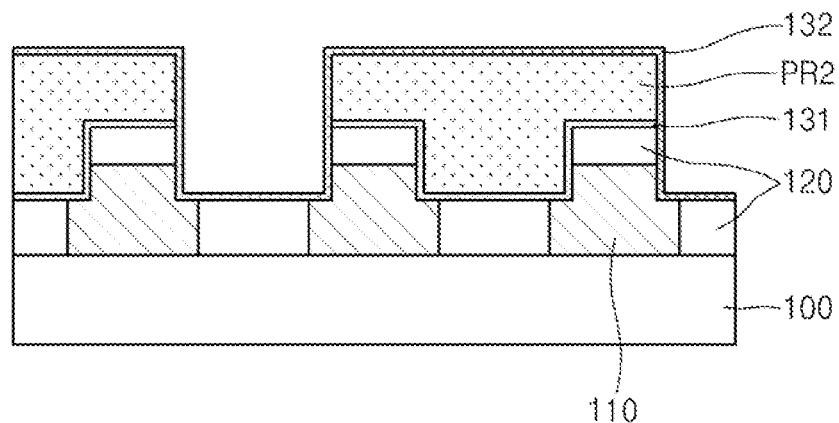

Referring to FIG. 23, a second resistance layer 132 of the resistive memory is formed along an inner wall of the first trench T2 on the overall surface of the resultant structure. The material and formation of the second resistance layer 132 are the same as those of the first embodiment; and a detailed description thereof will be omitted herein.

Figure 24:
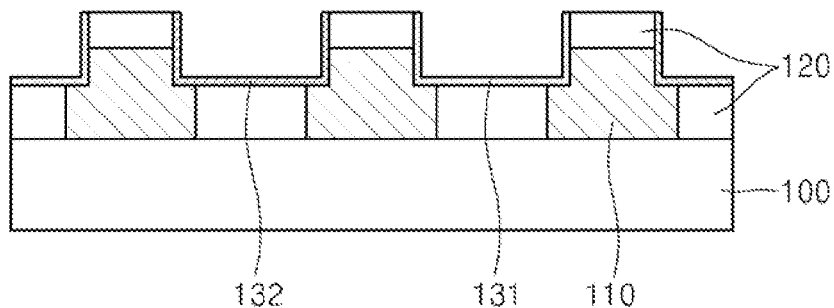

Referring to FIG. 24, the second resistance layer 132, the second photoresist pattern PR2, the first resistance layer 131, and the interlayer insulation layer 120 are subjected to anisotropic etching until the upper surface of the interlayer insulation layer 120 is exposed. For example, etching may be performed by CMP.

Subsequently, the remaining second photoresist pattern PR2 is removed. As a result, the first resistance layer 131 is formed at one side of the lower electrode 110, and the second resistance layer 132 is formed at the other side of the lower electrode 110 to face the first resistance layer 131.

Figure 25:
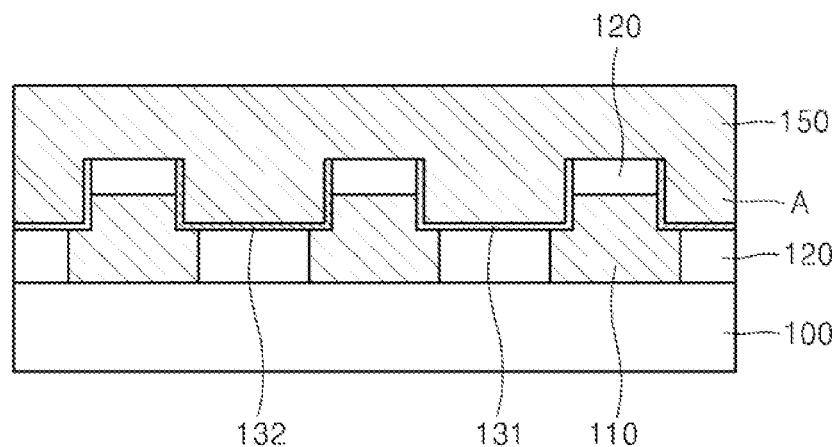

Referring to FIG. 25, after forming a conductive layer not shown) by depositing a conductive material on the upper surfaces of the first and second resistance layers 131, 132 and the interlayer insulation layer 120, bit lines 150 are formed by patterning the conductive layer in a stripe shape to intersect the lower electrode 110.

As a result, the bit lines 150, each of which has a protrusion A formed downward to contact the first or second resistance layer 131, 132, are formed. The protrusion A protrudes to a height lower than the upper surface of the lower electrode 110.

Except that the bit lines 150 are formed to have the protrusions A, the material of the bit lines 150 in this embodiment is the same as that in the first embodiment, and thus a repeated description thereof will be omitted herein.

Method of Fabricating Resistive Memory Cell

Embodiment 4

FIG. 26 to FIG. 29 are cross-sectional views of a method of fabricating the resistive memory device in accordance with the fourth embodiment of the present invention. In the fourth embodiment, the lower electrode is first formed to have partially etched side surfaces, followed by the subsequent processes. The processes after formation of the lower electrode are substantially the same as those of the first embodiment and thus will be described just briefly. The same reference numerals as those of the first embodiment denote the same elements.

Figure 26:
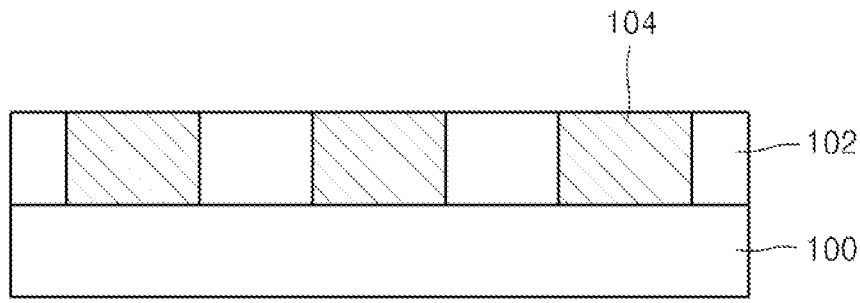
FIG. 26 to FIG. 29 are cross-sectional views of a method of fabricating the resistive memory device in accordance with the fourth embodiment of the present invention.

Referring to FIG. 26, a first mask layer 102 is formed on the semiconductor substrate 100. After forming a photoresist pattern (not shown), the first mask layer 102 is subjected to patterning through the photoresist pattern used as a mask. Subsequently, a region, on which a plurality of word lines WL1, WL2, WL3, . . . , WLn parallel to each other will be formed in the layout diagram of FIG. 2, is exposed.

The first mask layer W2 is formed to have a sufficient thickness to form a lower region of the lower electrode as shown in FIG. 3b and may be formed of a material having etching selectivity with respect to the material of the lower electrode. The first mask layer 102 may be funned of silicon oxide ($SiO_2$), silicon nitride (SiN), silicon oxy-nitride (SiON) or combinations thereof through chemical vapor deposition (CVD).

Subsequently, a lower conductive layer 104 is formed to form the lower electrode by filling an exposed region with a conductive material. The lower conductive layer 104 may be formed by depositing at least one selected from the group consisting of platinum (Pt), gold (Au), aluminum (Al), copper (Cu), titanium (Ti) and alloys thereof; nitride electrode materials including TiN or WN; and oxide electrode materials including $In_2O_3$:Sn (ITO), $SnO_2$:F (FTO), $SrTiO_3$, $LaNiO_3$, and the like. After deposition of the conductive material, to suitable flattening process such as etch back or CMP may be performed.

Figure 27:
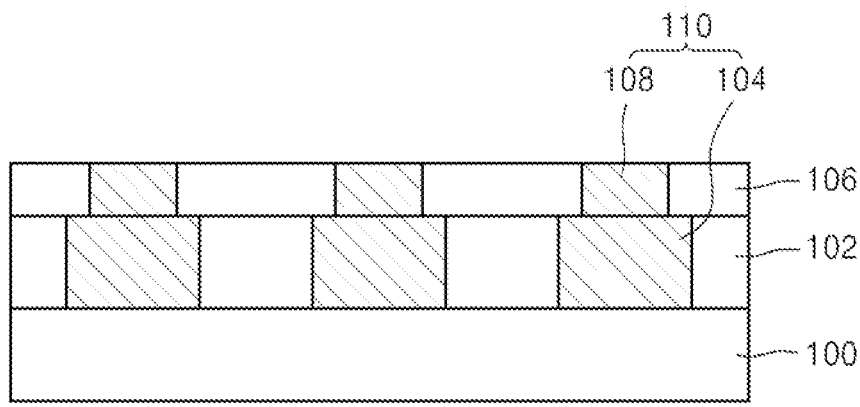

Referring to FIG. 27, a second mask layer 106 is formed to define an upper region of the lower electrode on the semiconductor substrate 100 which has the lower conductive layer 104 formed thereon. The second mask layer 106 is formed to expose part of an upper surface of the lower conductive layer 104. The second mask layer 106 may be formed by the same process as that of the first mask layer 102. Further, the second mask layer 106 may be formed of the same kind of material as that of the first mask layer 102 in order to have etching selectivity with respect to the lower conductive layer 104.

After forming the second mask layer 106 which exposes the region on which the upper region of the lower electrode will be formed, the exposed region is filled with the conductive material for the lower electrode to form an upper conductive layer 108 which has as narrower width than the lower conductive layer 104. The process of forming the upper conductive layer 108 may be the same as that for the lower conductive layer 104. In this way, the lower electrode 110 may be formed such that an upper side surface thereof can be partially etched.

Figure 28:
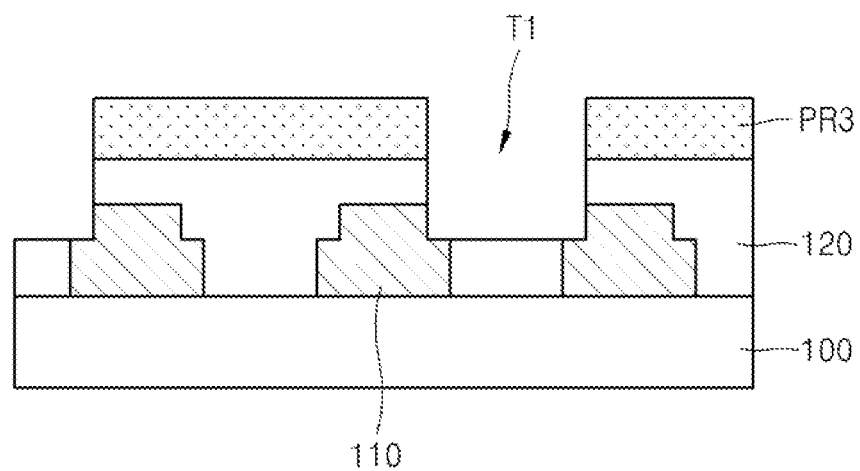

Referring to FIG. 28, a first interlayer insulation layer 120 is formed by depositing an insulation material to a desired thickness on the resultant structure, on which the lower electrode 110 having the partially etched upper side surface is formed. The first interlayer insulation layer 120 may be deposited to a desired thickness on the upper side of the lower electrode 110, with the first and second mask layers 102, 106 (see FIG. 27) remaining thereon. Alternatively, the first interlayer insulation layer 120 may be formed after removing the first and second mask layers 102, 106 (see FIG. 27).

Next, a photoresist pattern PR3 for defining a region on which the conductive line for the conductive pattern will be formed is formed on the first interlayer insulation layer 120. Subsequently, the first interlayer insulation layer 120 is subjected to etching through the photoresist pattern PR3 used as a mask to firm a first trench T1 between two adjacent word lines to expose part of one side of the lower electrode 110 and the interlayer insulation layer 120 between the two adjacent word lines. This embodiment does not need additional etching with respect to the lower electrode 110.

Figure 29:
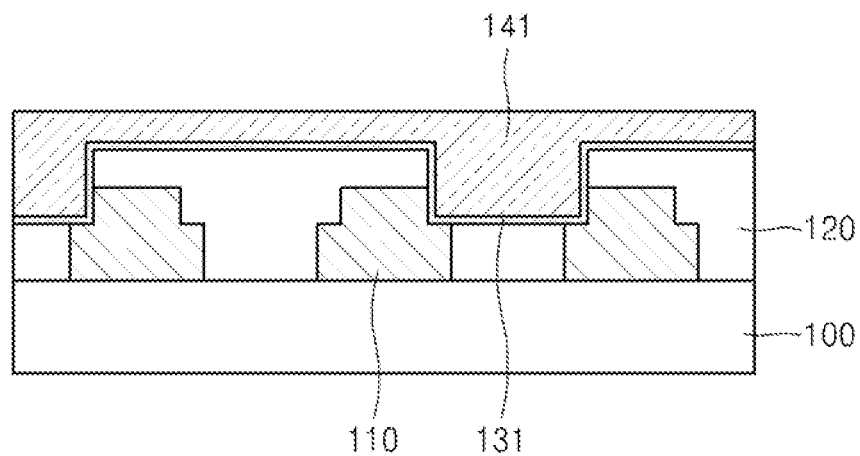

Referring to FIG. 29, after removing the photoresist pattern PR3 (see FIG. 28), a resistive material, which exhibits high resistance variation at a certain voltage, is deposited on the overall surface including the etched region to form a first resistance layer 131, and a conductive material is deposited on the first resistance layer 131 to form a first conductive layer 141 for forming the conductive line for the conductive pattern.

The processes for forming the first resistance layer 131 and the first conductive layer 141 may be the same as those of the first embodiment.

Subsequently, with reference to the processes of the first embodiment, the subsequent processes are performed to fabricate the resistive memory device according to the embodiment shown in FIG. 3b.

According to the embodiments, resistive memories are disposed at opposite sides of one word line intersecting hit lines, so that the number of memory cells can be increased two times while occupying the same area. In addition, variable resistance layers disposed at the opposite sides of the word line are composed of different materials exhibiting resistance variation at different voltages, or composed of the same kind of material with different properties such as different thicknesses or different, sized of contact areas with an electrode, so that two resistive memories can store different data according to voltage difference between the word line and the bit line, thereby embodying a multi-level device.

Further, the resistive memory is formed on a side surface of the word line including an edge thereof or on a side surface of the word line, from which part of the word line has been etched. Thus, when a voltage is applied to the word line for programming, erasing or reading of data, most of the electric field is concentrated on the edge or etched edge of the word line, thereby enabling operation of the resistive memory at a lower voltage than existing resistive memories. Further, the variable resistance layer may be formed as small as possible, thereby further lowering the operating voltage.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A resistive memory device comprising:
   First, second, and third lower electrodes each disposed over a substrate, each extending in a first direction, and arranged in parallel to each other at a uniform interval;
   an upper electrode extending over the first, the second, and the third lower electrodes and extending in a second direction, wherein the second direction is substantially perpendicular to the first direction;
   a first electrode protrusion extending downward in a third direction from the upper electrode to between the first and the second lower electrodes, wherein the third direction is substantially perpendicular to the first and the second directions;
   a second electrode protrusion extending downward in the third direction from the upper electrode to between the second and the third electrodes;
   a first resistance layer extending in the third direction and between a first sidewall of the second lower electrode and a first sidewall of the first electrode protrusion; and
   a second resistance layer extending in the third direction and between a second sidewall of the second lower electrode and a first sidewall of the second electrode protrusion,
   wherein the first resistance layer and the second resistance layer have resistance variation at different voltages applied between the upper electrode and the second lower electrode.

2. The resistive memory device of claim 1,
   wherein the second lower electrode includes a lower portion and an edged portion,
   wherein the lower portion extends in the first direction,
   wherein the edged portion extends upward in the third direction from the lower portion to between the first and the second electrode protrusions,
   wherein the first resistance layer extends between a first sidewall of the edged portion and the first sidewall of the first electrode protrusion, and
   wherein the second resistance layer extends between a second sidewall of the edged portion and the first sidewall of the second electrode protrusion.

3. The resistive memory device of claim 1, wherein the first and second resistance layers are formed of different materials.

4. The resistive memory device of claim 1,
   wherein the first and second resistance layers are formed of the same kind of material, and wherein the first and the second resistance layers have thicknesses different from each other.

5. The resistive memory device of claim 1, wherein each of the first and the second resistance layers includes a metal oxide layer, a PCMO (Pr (1-x)Ca(x)MnO3, 0<X<1) layer, a chalcogenide layer, a perovskite layer, and a metal-doped solid electrolyte layer.

6. The resistive memory device of claim 1, wherein each of the first and the second electrode protrusions extends down to a level lower than an upper surface of the second lower electrode.

7. The resistive memory device of claim 1, wherein each of the first and the second electrode protrusions is a conductive pattern.

8. The resistive memory device of claim 1, wherein the second lower electrode includes a lower portion and an edged portion,
   wherein the lower portion extends in the first direction,
   wherein the edged portion extends upward in the third direction from the lower portion of the second lower electrode to between the first and the second electrode protrusions,
   and wherein a width of the edged portion is narrower at than a width of at the lower portion of the second lower electrode.

9. The resistive memory device of claim 1, wherein the resistive memory device is operated in a unipolar switching mode or in a bipolar switching mode.

10. A resistive memory device comprising:
a plurality of first conductive lines each extending in a first direction and disposed in parallel to each other at a uniform interval;
a plurality of second conductive lines each extending in a second direction, disposed over the plurality of first conductive lines, and arranged in parallel to each other, wherein the second direction is substantially perpendicular to the first direction; and resistive memory cells disposed at intersections between-of the plurality of first conductive lines and the plurality of second conductive lines,
wherein each of the resistive memory cells comprises:
a first electrode protrusion extending downward in a third direction from one of the plurality of second conductive lines to over a first sidewall of one of the plurality of first conductive lines, wherein the third direction is substantially perpendicular to the first and the second directions,
a second electrode protrusion extending downward in the third direction from the one of the plurality of second conductive lines to over a second sidewall of the one of the plurality of first conductive lines,
a first resistance layer extending in the third direction and extending between the first electrode protrusion and the first sidewall of the one of the plurality of first conductive lines,
and a second resistance layer extending in the third direction and extending between the second electrode protrusion and the second sidewall of the one of the plurality of first conductive lines, and
wherein the first resistance layer and the second resistance layer have resistance variation at different voltages applied between the one of the plurality of second conductive lines and the one of the plurality of first conductive lines.

11. The resistive memory device of claim 10,
wherein the one of the plurality of first conductive lines includes an edged portion,
wherein the edged portion extends upward in the third direction to between the first and the second electrode protrusions,
wherein the first resistance layer extends between the first electrode protrusion and a first sidewall of the edged portion, and
wherein the second resistance layer extends between the second electrode protrusion and a second sidewall of the edged portion.

12. The resistive memory device of claim 10, wherein each of the first and the second electrode protrusions extends down to a level lower than an upper surface of the one of the plurality of first conductive lines.

13. The resistive memory device of claim 10, wherein each of the first and the second electrode protrusions is a conductive patterns.

14. The resistive memory device of claim 10, wherein the first and the second resistance layers are formed of different materials.

15. The resistive memory device of claim 10, wherein the first and the second resistance layers are formed of the same kind of material, and
wherein the first and the second resistance layers have thicknesses different from each other.

16. The resistive memory device of claim 10, wherein each of the resistive memory cells are arranged side by side along the second direction.

17. The resistive memory device of claim 10,
wherein the one of the plurality of first conductive lines includes a lower portion and an edged portion,
wherein the lower portion extends in the first direction,
wherein the edged portion extends upward in the third direction from the lower portion to between the first and the second electrode protrusions, and
wherein a width of the edged portion is narrower than the lower portion.

18. The resistive memory device of claim 10, wherein the resistive memory device is operated according to a unipolar switching curve or a bipolar switching curve.

19. A resistive memory device comprising:
a plurality of first data lines each extending in a first direction and disposed in parallel to each other at a uniform interval;
a plurality of second data lines each extending in a second direction, disposed over the plurality of first data lines, and arranged in parallel to each other, wherein the second direction is substantially perpendicular to the first direction; and
a first resistive memory disposed between at an intersection between one of the plurality of first data lines and one of the plurality of second data lines,
wherein the first resistive memory comprises:
a first electrode protrusion extending downward in a third direction from the one of the plurality of second data lines to over a first sidewall of the one of the plurality of first data lines, wherein the third direction is substantially perpendicular to the first and the second directions,
a second electrode protrusion extending downward in the third direction from the one of the plurality of second data lines to over a second sidewall of the one of the plurality of first data lines,
a first resistance layer extending in the third direction and extending between the first electrode protrusion and the first sidewall of the one of the plurality of first data lines, and
a second resistance layer extending in the third direction and extending between the second electrode protrusion and the second sidewall of the one of the plurality of first data lines,
wherein the first resistance layer and the second resistance layer have resistance variation at different voltages applied between the one of the plurality of second data lines and the one of the plurality of first data lines.

20. The resistive memory device of claim 19, wherein each of the first and the second electrode protrusions is a conductive pattern.

21. The resistive memory device of claim 19, further comprising:
a control device disposed between the one of the plurality of second data lines and the resistive memory to control electric current flowing into the first resistive memory.

22. The resistive memory device of claim 21, wherein the control device comprises a diode or a transistor.

23. The resistive memory device of claim 19, further comprising:
a plurality of third data lines each extending in the first direction, disposed over the plurality of second data lines, and arranged in parallel to each other at a uniform interval;
a plurality of fourth data lines each extending in the second direction, disposed over the plurality of third data lines, and arranged in parallel to each other at a uniform interval; and a second resistive memory disposed at an intersection between one of the plurality of third data lines and one of the plurality of fourth data lines,
wherein the first resistive memory and the second resistive memory
are stacked vertically along the third direction to constitute a multilayer structure.

24. The resistive memory device of claim 19, wherein the resistive memory device is operated according to a unipolar switching curve or a bipolar switching curve.

25. The resistive memory device of claim 1,
wherein the first and second resistance layers are formed of the same kind of material,
wherein the first and second resistance layers have first and second contact areas which are coupled to the second lower electrode, respectively, and
wherein the first and the second contact areas are different from each other in size.

26. The resistive memory device of claim 1,
wherein the first and second resistance layers are formed of the same kind of material,
wherein the first and second resistance layers have third and fourth contact areas which are coupled to the upper electrode, respectively, and
wherein the third and the fourth contact areas are different from each other in size.

* * * * *